(12) United States Patent
Chung et al.

(10) Patent No.: US 8,086,929 B2
(45) Date of Patent: Dec. 27, 2011

(54) METHOD OF EXECUTING LDPC CODING USING PARITY CHECK MATRIX

(75) Inventors: Ji Wook Chung, Gyeonggi-do (KR); Min Seok Oh, Seoul (KR); Ki Hyoung Cho, Seoul (KR); Seung Hyun Kang, Gyeonggi-do (KR); Young Cheul Yoon, San Diego, CA (US); Sang Gook Kim, San Diego, CA (US); Ji Ae Seok, Gyeonggi-do (KR); Young Seob Lee, Gyeonggi-do (KR); So Yeon Kim, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 1072 days.

(21) Appl. No.: 11/942,645

(22) Filed: Nov. 19, 2007

(65) Prior Publication Data

US 2008/0126916 A1 May 29, 2008

(30) Foreign Application Priority Data

Nov. 17, 2006 (KR) .................. 10-2006-0114018
Nov. 17, 2006 (KR) .................. 10-2006-0114019

(51) Int. Cl.
*H03M 13/00* (2006.01)
*H04L 1/18* (2006.01)
*G06F 11/00* (2006.01)

(52) U.S. Cl. ........ 714/752; 714/751; 714/755; 714/758; 714/759; 714/800; 714/807

(58) Field of Classification Search .................. None
See application file for complete search history.

(56) References Cited

U.S. PATENT DOCUMENTS

| | | | |
|---|---|---|---|
| 7,080,293 B2 * | 7/2006 | Kim et al. ............. | 714/701 |
| 7,627,805 B2 * | 12/2009 | Mittelsteadt et al. ......... | 714/800 |
| 2004/0123229 A1 * | 6/2004 | Kim et al. ............. | 714/800 |
| 2005/0235195 A1 * | 10/2005 | Choi et al. ............. | 714/800 |
| 2007/0038916 A1 * | 2/2007 | Mittelsteadt et al. ......... | 714/758 |
| 2007/0162811 A1 * | 7/2007 | Matsumoto ............. | 714/749 |
| 2009/0228771 A1 * | 9/2009 | Shasha ............. | 714/801 |
| 2009/0259915 A1 * | 10/2009 | Livshitz et al. ............. | 714/758 |
| 2010/0211847 A1 * | 8/2010 | Livshitz et al. ............. | 714/752 |

\* cited by examiner

*Primary Examiner* — Jeffrey A Gaffin
*Assistant Examiner* — Guerrier Merant
(74) *Attorney, Agent, or Firm* — Lee, Hong, Degerman, Kang & Waimey

(57) ABSTRACT

A low density parity check (LDPC) coding method, and more particularly, a method of executing LDPC coding using a parity check matrix is disclosed. The present invention comprises providing an information bit stream for channel encoding, and encoding the information bit stream by using a first parity check matrix including at least one row generated by combining at least two rows of a second parity check matrix.

6 Claims, 31 Drawing Sheets

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|---|
| 501 — 0 | 10 | 82 | 122 | 101 | 9 | 102 | | 85 | 125 | 56 | 121 | 58 | 24 | 82 | | 69 | 58 | 106 | 5 | 20 | 0 | | | | |
| 502 — 1 | 37 | 77 | | 61 | 74 | 114 | 118 | 90 | 31 | | 86 | | 13 | 5 | 7 | 47 | 13 | 90 | 23 | | 0 | 0 | | | |
| 503 — 2 | 5 | 54 | 53 | 26 | | 104 | 6 | 24 | 116 | 104 | 36 | 84 | 32 | | 107 | | 41 | 12 | | 107 | | 0 | 0 | | |
| 504A — 3 | | 43 | | 49 | | | 12 | | 59 | | | 14 | | | 86 | | 82 | | 75 | | | | 0 | | 127 |
| 504B — 4 | 38 | | 43 | | 0 | | | 71 | | 60 | | | | 50 | | 107 | | 127 | | 122 | | | | 0 | 127 |

$$H = \begin{bmatrix} P^{h_{00}^b} & P^{h_{01}^b} & P^{h_{02}^b} & \cdots & P^{h_{0nb}^b} \\ P^{h_{10}^b} & P^{h_{11}^b} & P^{h_{12}^b} & \cdots & P^{h_{1nb}^b} \\ \cdots & \cdots & \cdots & \cdots & \cdots \\ P^{h_{mb0}^b} & P^{h_{mb1}^b} & P^{h_{mb2}^b} & \cdots & P^{h_{mbnb}^b} \end{bmatrix} = P^{H_b}$$

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|---|
| 1201—0 | 10 | 82 | 122 | | 9 | | | 85 | | 56 | | 58 | | 82 | | | 58 | | 5 | | 117 | | | | | | | |
| 1202—1 | | | | 101 | | 102 | | | 125 | | 121 | | 24 | | | 69 | | 106 | | 20 | 117 | 0 | 113 | | | | | |
| 1203—2 | 37 | 77 | | 61 | 74 | | 118 | | 31 | | | | 13 | 5 | 7 | | 13 | | 23 | | | 0 | 113 | 0 | | | | |
| 1204—3 | | | 53 | | | 114 | | 90 | | 104 | 86 | 84 | | | 107 | 47 | | 90 | | | | | | | 119 | | | |
| 1205—4 | 5 | | | 26 | | 104 | 6 | 24 | 116 | | 36 | | 32 | | | | 41 | 12 | | 107 | | | | | | 0 | | |
| 1206—5 | | 54 | | 49 | | | 12 | | 59 | | | 14 | | | 86 | | 82 | | 75 | | | | | | 119 | 0 | 127 | |
| 1207—6 | | 43 | 43 | | 0 | | | 71 | | 60 | | | | 50 | | 107 | | 127 | | 122 | | | | | | | 127 | 0 |
| 1208—7 | 38 | | | | | | | | | | | | | | | | | | | | | | | | | | | |

FIG. 13A

| 1201— 0 | 10 | 122 |  | 9 |  | 85 |  | 56 | 121 | 58 | 24 | 82 |  | 58 |  | 5 | 117 |  |  |  |  |  |
|---|---|---|---|---|---|---|---|---|---|---|---|---|---|---|---|---|---|---|---|---|---|---|
| 1202— 1 | 82 |  | 101 |  | 102 |  | 125 |  |  |  |  |  | 69 | 106 |  | 20 | 117 | 0 |  |  |  |  |

| Combined row 1301 | 10 | 82 | 122 | 101 | 9 | 102 | 85 | 125 | 56 | 121 | 58 | 24 | 82 | 69 | 58 | 106 | 5 | 20 | 117 | 0 |  |  |  |
|---|---|---|---|---|---|---|---|---|---|---|---|---|---|---|---|---|---|---|---|---|---|---|---|

| Combined row | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|---|
| 1301 | 10 | 82 | 122 | 101 | 9 | 102 |  | 85 | 125 | 56 | 121 | 58 | 24 | 82 |  | 69 | 58 | 106 | 5 | 20 |  | 0 |  |  |  |  |  |  |
| 1203—2 |  | 77 |  |  | 74 |  | 118 |  | 31 |  |  |  | 13 |  | 7 |  | 13 |  | 23 |  |  | 0 | 113 | 0 |  |  |  |  |
| 1204—3 | 37 |  | 53 | 61 |  | 114 |  | 90 |  |  | 86 |  |  | 5 | 107 | 47 |  | 90 |  |  |  |  | 113 |  | 119 | 0 |  |  |
| 1205—4 | 5 |  |  |  |  | 104 | 6 | 24 | 116 | 104 |  | 84 |  |  |  |  | 41 | 12 |  | 107 |  |  |  |  |  |  |  |  |
| 1206—5 |  | 54 |  | 26 |  |  |  |  | 59 |  | 36 |  | 32 |  |  |  | 82 |  | 75 |  |  |  |  | 0 | 119 | 0 |  |  |
| 1207—6 |  | 43 |  | 49 |  |  | 12 | 71 |  | 60 |  | 14 |  | 50 | 86 | 107 |  | 127 |  | 122 |  |  |  |  |  |  | 127 |  |
| 1208—7 | 38 |  | 43 |  | 0 |  |  |  |  |  |  |  |  |  |  |  |  |  |  |  |  |  |  |  |  |  | 127 | 0 |

FIG. 15

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|---|
| 1301 1302 Combined row 1 | 10 | 82 | 122 | 101 | 9 | 102 | | 85 | 125 | 56 | 121 | 58 | 24 | 82 | | 69 | 58 | 106 | 5 | 20 | | 0 | | | | | | |
| Combined row 2 | 37 | 77 | | 61 | 74 | 114 | 118 | 90 | 31 | | 86 | | 13 | 5 | 7 | 47 | 13 | 90 | 23 | | | 0 | | 0 | | | | |
| 1205—3 | 5 | | 53 | | | | | 24 | | 104 | | 84 | | | 107 | | | 12 | | | | | | 0 | 119 | | | |
| 1206—4 | | 54 | | 26 | | | 6 | | 116 | | 36 | | 32 | | | 41 | | | | 107 | | | | | 119 | 0 | | |
| 1207—5 | | 43 | | 49 | | | 12 | | 59 | | | 14 | | | 86 | | 82 | 127 | 75 | | | | | | | 0 | 127 | |
| 1208—6 | 38 | | 43 | | 0 | | | 71 | | 60 | | | | 50 | | 107 | | | | 122 | | | | | | | 127 | 0 |

FIG. 16

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|---|
| Combined row 1 (1301, 1302, 1303) | 10 | 82 | 122 | 101 | 9 | 102 | | 85 | 125 | 56 | 121 | 58 | 24 | 82 | | 69 | 58 | 106 | 5 | 20 | | 0 | | | | | | |
| Combined row 2 | 37 | 77 | | 61 | 74 | 114 | 118 | 90 | 31 | | 86 | | 13 | 5 | 7 | 47 | 13 | 90 | 23 | | | 0 | | 0 | | 0 | | |
| Combined row 3 | 5 | 54 | 53 | 26 | | 104 | 6 | 24 | 116 | 104 | 36 | 84 | 32 | | 107 | | 41 | 12 | | 107 | | | 0 | 0 | | 0 | 127 | |
| 1207 ~ 5 | | 43 | | 49 | | | 12 | | 59 | | | 14 | | 50 | 86 | 107 | 82 | 127 | 75 | 122 | | | | | | | 127 | 0 |
| 1208 ~ 6 | 38 | | 43 | | 0 | | | 71 | | 60 | | | | | | | | | | | | | | | | | | |

FIG. 17

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|---|
| Combined row 1 | 10 | 82 | 122 | 101 | 9 | 102 | | 85 | 125 | 56 | 121 | 58 | 24 | 82 | | 69 | 58 | 106 | 5 | 20 | | 0 | | | | | | |
| Combined row 2 | 37 | 77 | | 61 | 74 | 114 | 118 | 90 | 31 | | 86 | | 13 | 5 | 7 | 47 | 13 | 90 | 23 | | | 0 | 0 | 0 | | | | |
| Combined row 3 | 5 | 54 | 53 | 26 | | 104 | 6 | 24 | 116 | 104 | 36 | 84 | 32 | | 107 | | 41 | 12 | | 107 | | | 0 | 0 | | 0 | | |
| Combined row 4 | 38 | 43 | 43 | 49 | 0 | | 12 | 71 | 59 | 60 | | 14 | | 50 | 86 | 107 | 82 | 127 | 75 | 122 | | | | | | 0 | | 0 |

| | 0 | 1 | 2 | 3 | 4 | 5 | 6 | 7 | 8 | 9 | 10 | 11 | 12 | 13 | 14 | 15 | 16 | 17 | 18 | 19 | 21 | 23 | 25 | 27 |
|---|---|---|---|---|---|---|---|---|---|---|---|---|---|---|---|---|---|---|---|---|---|---|---|---|
| Combined row 1 | 10 | 82 | 122 | 101 | 9 | 102 |  | 85 | 125 | 56 | 121 | 58 | 24 | 82 |  | 69 | 58 | 106 | 5 | 20 | 0 |  |  |  |
| Combined row 2 | 37 | 77 |  | 61 | 74 | 114 | 118 | 90 | 31 |  | 86 |  | 13 | 5 | 7 | 47 | 13 | 90 | 23 |  | 0 | 0 |  |  |
| Combined row 3 | 5 | 54 | 53 | 26 |  | 104 | 6 | 24 | 116 | 104 | 36 | 84 | 32 |  | 107 |  | 41 | 12 |  | 107 |  | 0 | 0 |  |
| Combined row 4 | 38 | 43 | 43 | 49 | 0 |  | 12 | 71 | 59 | 60 |  | 14 |  | 50 | 86 | 107 | 82 | 127 | 75 | 122 |  |  | 0 | 0 |

| | 0 | 1 | 2 | 3 | 4 | 5 | 6 | 7 | 8 | 9 | 10 | 11 | 12 | 13 | 14 | 15 | 16 | 17 | 18 | 19 | 21 | 23 | 24 | 25 | 26 | 27 |
|---|---|---|---|---|---|---|---|---|---|---|---|---|---|---|---|---|---|---|---|---|---|---|---|---|---|---|
| 1901 1902 Combined row 1 | 10 | 82 | 122 | 101 | 9 | 102 | | 85 | 125 | 56 | 121 | 58 | 24 | 82 | | 69 | 58 | 106 | 5 | 20 | 0 | | | | | |
| Combined row 2 | 37 | 77 | | 61 | 74 | 114 | 118 | 90 | 31 | | 86 | | 13 | 5 | 7 | 47 | 13 | 90 | 23 | | 0 | 0 | 119 | | | |
| 1903—3 | 5 | | 53 | | | | | 24 | | 104 | | 84 | | | 107 | | | 12 | | | | | | | | |
| 1904—4 | | 54 | | 26 | | 104 | 6 | | 116 | | 36 | | 32 | | | | 41 | | | 107 | | 0 | 119 | 0 | | |
| 1905—5 | | 43 | | 49 | | | 12 | | 59 | | | 14 | | | 86 | | 82 | | 75 | | | | | | 127 | |
| 1906—6 | 38 | | 43 | | 0 | | | 71 | | 60 | | | | 50 | | 107 | | 127 | | 122 | | | | 0 | 127 | 0 |

FIG. 20

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|---|
| 501 — 0 | 10 | 82 | 122 | 101 | 9 | 102 |  | 85 | 125 | 56 | 121 | 58 | 24 | 82 |  | 69 | 58 | 106 | 5 | 20 | 0 |  |  |  |  |
| 502 — 1 | 37 | 77 |  | 61 | 74 | 114 | 118 | 90 | 31 |  | 86 |  | 13 | 5 | 7 | 47 | 13 | 90 | 23 |  | 0 | 0 | 0 |  |  |
| 503 — 2 | 5 | 54 | 53 | 26 |  | 104 | 6 | 24 | 116 | 104 | 36 | 84 | 32 |  | 107 |  | 41 | 12 |  | 107 |  | 0 | 0 |  | 127 |
| 504A — 3 |  | 43 |  | 49 | 0 |  | 12 |  | 59 |  |  | 14 |  | 50 | 86 |  | 82 |  | 75 |  |  |  | 0 | 0 | 127 |
| 504B — 4 | 38 |  | 43 |  |  |  |  | 71 |  | 60 |  |  |  |  |  | 107 |  | 127 |  | 122 |  |  |  | 0 |  |

FIG. 21

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|---|
| 501—0  | 10 | 82 | 122 | 101 | 9  | 102 |     | 85 | 125 | 56  | 121 | 58 | 24 | 82 |     | 69  | 58 | 106 | 5  | 20  | 0 |   |   |   |     | 119 |
| 502—1  | 37 | 77 |     | 61  | 74 | 114 | 118 | 90 | 31  |     | 86  |    | 13 | 5  | 7   | 47  | 13 | 90  | 23 |     | 0 | 0 |   |   |     |     |
| 503A—2 | 5  |    | 53  |     |    | 104 |     | 24 |     | 104 |     | 84 |    |    | 107 |     |    | 12  |    | 107 |   | 0 | 0 |   |     |     |
| 503B—3 |    | 54 |     | 26  |    |     | 6   |    | 116 |     | 36  |    | 32 |    |     |     | 41 |     |    |     |   |   | 0 | 0 |     |     |
| 504B—4 |    | 43 |     | 49  |    |     | 12  |    | 59  |     |     | 14 |    | 50 | 86  |     | 82 | 127 | 75 | 107 |   |   |   |   | 127 |     |
| 504B—5 | 38 |    | 43  |     | 0  |     |     | 71 |     | 60  |     |    |    |    |     | 107 |    |     |    | 122 |   |   |   |   | 127 | 119 |

FIG. 22

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 |
|---|---|---|---|---|---|---|---|---|---|---|---|---|---|---|---|---|---|---|---|---|---|---|---|---|---|---|---|
| 501A—0 | | 82 | | 101 | | 102 | | | 125 | | 121 | | 24 | | | 69 | | 106 | | 20 | 0 | | | | | | |
| 501B—1 | 10 | | 122 | | 9 | | | 85 | | 56 | | 58 | | 82 | | | 58 | | 5 | | | 0 | 0 | | | | |
| 502—2 | 37 | 77 | | 61 | 74 | | 118 | 90 | 31 | | 86 | | 13 | 5 | 7 | 47 | 13 | 90 | 23 | | | 0 | | | | | |
| 503A—3 | 5 | | 53 | | 114 | 114 | | 24 | | 104 | | 84 | | | 107 | | | 12 | | 107 | | | | | | 119 | |
| 503B—4 | | 54 | | 26 | | 104 | 6 | | 116 | | 36 | | 32 | | 86 | | 41 | | 75 | | | | | | | 119 | |
| 504B—5 | | 43 | 49 | | | | 12 | | 59 | | | 14 | | | | | 82 | 127 | | 122 | | | 0 | | 127 | | 117 |
| 504B—6 | 38 | | 43 | | 0 | | | 71 | | 60 | | | | 50 | | 107 | | | | | | | | 0 | 127 | | 117 |

FIG. 23

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|---|
| 501A~0 | | 82 | | 101 | | 102 | | | 125 | | 121 | | 24 | | | 69 | | 106 | | 20 | 0 | | | | | | | |
| 501B~1 | 10 | | 122 | | 9 | | 118 | 85 | | 56 | | 58 | | 82 | 7 | | 58 | | 5 | | | | | | | | 117 | |
| 502A~2 | | 77 | | 61 | 74 | | | | 31 | | | | 13 | | | | 13 | | 23 | | 0 | | | | | | 117 | 113 |
| 502B~3 | 37 | | 53 | | | 114 | | 90 | | | 86 | | | 5 | 107 | 47 | | 90 | | | | 0 | | | | | | 113 |
| 503A~4 | | 54 | | 26 | | 104 | 6 | 24 | 116 | 104 | 36 | 84 | 32 | | | | 41 | | | | | 0 | 0 | | | 119 | | |
| 503B~5 | 5 | | 43 | 49 | | | 12 | | 59 | | | 14 | | | 86 | | 82 | | 75 | 107 | | | 0 | | 127 | 119 | | |
| 504A~6 | | 43 | | | 0 | 104 | | 71 | | 60 | | | | 50 | | 107 | | 127 | | 122 | | | | 0 | 127 | | | |
| 504B~7 | 38 | | 43 | | | | | | | | | | | | | | | | | | | | | | | | | |

FIG. 24

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|---|---|---|---|---|---|---|---|---|---|---|
| (1) 0 | 10 | 82 | 122 | | | | | | | | | | | | | | | | | | | | | | | | 117 | |
| 2 | | 77 | | 101 | 9 | 102 | 118 | 85 | 125 | 56 | 121 | 58 | | 82 | | | 58 | | | | | | | | | | 117 | 113 |
| 3 | 37 | | 53 | 61 | 74 | 114 | | 90 | 31 | | 86 | | 24 | | 7 | 69 | | 106 | | 20 | 0 | | | | | | | 113 |
| 4 | 5 | 54 | | 26 | 104 | 104 | 6 | 24 | | 104 | | 84 | 13 | 5 | 107 | 47 | 13 | 90 | 23 | | 0 | 0 | | | | 119 | | |
| 5 | | 43 | | 49 | | | 12 | | 116 | | 36 | 14 | 32 | | 86 | | 41 | 12 | | | | 0 | 0 | | | 119 | | |
| 6 | | | 43 | | 0 | | | 71 | 59 | 60 | | | | 50 | 107 | 107 | 82 | | 75 | 107 | | | 0 | 0 | 127 | | | |
| 7 | 38 | | | | | | | | | | | | | | | | | 127 | | 122 | | | | | 127 | | | |

FIG. 25

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | (27) | 24 | 25 | 26 | (23) |
|---|---|---|---|---|---|---|---|---|---|---|---|---|---|---|---|---|---|---|---|---|---|---|---|---|---|---|---|---|
| 0 | 10 | | | | | | | | | | | | | | | | | | | | | | | | | | | |
| 1 | | 82 | 122 | | 9 | | | 85 | | 56 | | 58 | | 82 | | | 58 | | 5 | | | | | | | | | |
| 2 | | 77 | | 101 | | 102 | 118 | | 125 | | 121 | | 24 | | | 69 | | 106 | | 20 | | | | 113 | | | 117 | |
| 3 | 37 | | 53 | | 74 | 114 | | 90 | 31 | | | | 13 | 5 | 7 | 47 | 13 | 90 | 23 | | 0 | | 0 | 113 | | 119 | 117 | |
| 4 | 5 | 54 | | 61 | | 104 | 6 | 24 | 116 | 104 | 86 | 84 | | | 107 | | | 12 | | | 0 | 0 | 0 | | | 119 | | |
| 5 | | | | 26 | | | 12 | | 59 | | 36 | 14 | 32 | | | | 41 | | | 107 | | | | | | | | |
| 6 | | 43 | 43 | 49 | 0 | | | 71 | | 60 | | | | 50 | 86 | 107 | 82 | 127 | 75 | 122 | | | | | 127 | | | |
| 7 | 38 | | | | | | | | | | | | | | | | | | | | | | | | 127 | | | 0 |

FIG. 26

| | 0 | 1 | 2 | 3 | 4 | 5 | 6 | 7 | 8 | 9 | 10 | 11 | 12 | 13 | 14 | 15 | 16 | 17 | 18 | 19 | (26) | 21 | 22 | 24 | 25 | 27 | (20) | 23 |
|---|---|---|---|---|---|---|---|---|---|---|---|---|---|---|---|---|---|---|---|---|---|---|---|---|---|---|---|---|
| 1 | 10 | | 122 | | 9 | | | 85 | | 56 | | 58 | | 82 | | | 58 | | 5 | | | | | | | | | |
| 0 | 82 | | | 101 | | 102 | 118 | | 125 | | 121 | | 24 | | 7 | 69 | | 106 | | 20 | 117 | | | | | | 0 | |
| 2 | 77 | | 53 | | 74 | | | | 31 | | | | | | | | | | | | 117 | | | | | 113 | 0 | |
| 3 | 37 | | | 61 | | 114 | | 90 | | 104 | 86 | | 13 | 5 | 107 | 47 | 13 | 90 | 23 | | | 0 | 0 | | 119 | 113 | | |
| 4 | 5 | 54 | | 26 | | 104 | 6 | 24 | 116 | | 36 | 84 | 32 | | | | 41 | 12 | | 107 | | 0 | 0 | 127 | 119 | | | |
| 5 | | 43 | | 49 | | | 12 | | 59 | | | 14 | | 50 | 86 | | 82 | | 75 | | | | | 127 | | | | |
| 6 | 38 | 43 | 43 | | 0 | | | 71 | | 60 | | | | | | 107 | | 127 | | 122 | | | | | | | | |
| 7 | | | | | | | | | | | | | | | | | | | | | | | | | | | | 0 |

FIG. 27

| | 0 | 1 | 2 | 3 | 4 | 5 | 6 | 7 | 8 | 9 | 10 | 11 | 12 | 13 | 14 | 15 | 16 | 17 | 18 | 19 | 26 | (20) | 22 | 24 | 25 | 27 | (21) | 23 |
|---|---|---|---|---|---|---|---|---|---|---|---|---|---|---|---|---|---|---|---|---|---|---|---|---|---|---|---|---|
| 1 | 10 | 82 | 122 | | 9 | | | 85 | | 56 | | 58 | | 82 | | | 58 | | | | | | | | | | | |
| 0 | | | | 101 | | 102 | | | 125 | | 121 | | 24 | | | 69 | | 106 | 5 | 20 | 117 | | | | | | | |
| 2 | | | | | | | 118 | | | | | | | | | | | | | | 117 | 0 | | | | 113 | | |
| 3 | 37 | | 53 | 61 | 74 | 114 | | 90 | 31 | | 86 | | 13 | 5 | 7 | 47 | 13 | 90 | 23 | | | | | | | | 0 | |
| 4 | 5 | | | | | 104 | | 24 | | 104 | | 84 | | | 107 | | | | | | | 0 | | | | 113 | 0 | |
| 5 | | 54 | | 26 | | | 6 | | 116 | | 36 | | 32 | | | | 41 | 12 | | 107 | | | 0 | | 119 | | | |
| 6 | | 43 | 43 | 49 | | | 12 | 71 | 59 | 60 | | 14 | | 50 | 86 | 107 | 82 | | | | | | 0 | 127 | 119 | | | |
| 7 | 38 | | | | 0 | | | | | | | | | | | | | 127 | 75 | 122 | | | 127 | | | | | 0 |

FIG. 28

| | 0 | 1 | 2 | 3 | 4 | 5 | 6 | 7 | 8 | 9 | 10 | 11 | 12 | 13 | 14 | 15 | 16 | 17 | 18 | 19 | 26 | 20 | (27) | 24 | 25 | (22) | 21 | 23 |
|---|---|---|---|---|---|---|---|---|---|---|---|---|---|---|---|---|---|---|---|---|---|---|---|---|---|---|---|---|
| 0 | 10 | | | | | | | | | | | | | | | | | | | | | | | | | | | |
| 1 | | 82 | 122 | 101 | 9 | 102 | 118 | 85 | 125 | 56 | 121 | 58 | 24 | 82 | | | 58 | 106 | 5 | | 117 | | | | | | | |
| 2 | 37 | 77 | | | 74 | | | | | | | | | | 7 | 69 | | | | 20 | 117 | | | | | | | |
| 3 | 5 | 54 | 53 | 61 | | 114 | | 90 | 31 | | 86 | | 13 | 5 | | 47 | 13 | 90 | 23 | | | 0 | 113 | | | | | |
| 4 | | 43 | | 26 | | 104 | 6 | 24 | 116 | 104 | | 84 | | | 107 | | 41 | 12 | | 107 | | 0 | 113 | | 119 | | 0 | |
| 5 | | 43 | | 49 | 0 | | 12 | | 59 | | 36 | | 32 | | 86 | | 82 | | 75 | | | | | 127 | 119 | | 0 | |
| 6 | | | | | | | | | | | | 14 | | 50 | | 107 | | 127 | | 122 | | | | 127 | | | | |
| 7 | 38 | | | | | | | 71 | | 60 | | | | | | | | | | | | | | | | | | 0 |

|   | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|----|----|----|----|----|----|----|----|----|----|----|----|----|----|
| 0 | 10 | 82 | 122 | 101 | 9 | 102 |  | 85 | 125 | 56 | 121 | 58 | 24 | 82 |  | 69 | 58 | 106 | 5 | 20 | 0 |  |  |  |
| 1 | 37 | 77 |  | 61 | 74 | 114 | 118 | 90 | 31 |  | 86 |  | 13 | 5 | 7 | 47 | 13 | 90 | 23 |  | 0 | 0 |  |  |
| 2 | 5 | 54 | 53 | 26 |  | 104 | 6 | 24 | 116 | 104 | 36 | 84 | 32 |  | 107 |  | 41 | 12 |  | 107 |  | 0 | 0 |  |
| 3 | 38 | 43 | 43 | 49 | 0 |  | 12 | 71 | 59 | 60 |  | 14 |  | 50 | 86 | 107 | 82 | 127 | 75 | 122 |  |  | 0 | 0 |

FIG. 31

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 |
|---|---|---|---|---|---|---|---|---|---|---|---|---|---|---|---|---|---|---|---|---|---|---|---|---|---|---|
| 0 | 10 | 82 | 122 | 101 | 9 | 102 | | 85 | 125 | 56 | 121 | 58 | 24 | 82 | | 69 | 58 | 106 | 5 | 20 | 0 | | | | | |
| 1 | 37 | 77 | | 61 | 74 | 114 | 118 | 90 | 31 | | 86 | | 13 | 5 | 7 | 47 | 13 | 90 | 23 | | 0 | 0 | | | | |
| 2 | 5 | | 53 | | | 104 | | 24 | | 104 | | 84 | | | 107 | | | 12 | | 107 | | 0 | 0 | | | 119 |
| 3 | | 54 | | 26 | | | 6 | | 116 | | 36 | | 32 | | | | 41 | | | | | | 0 | 0 | | 119 |
| 4 | | 43 | | 49 | 0 | | 12 | | 59 | 60 | | 14 | | 50 | 86 | 107 | 82 | | 75 | 122 | | | | | 127 | |
| 5 | 38 | | | | | | | 71 | | | | | | | | | | 127 | | | | | | 0 | 127 | |

METHOD OF EXECUTING LDPC CODING USING PARITY CHECK MATRIX

This application claims the benefit of the Korean Patent Application Nos. P2006-114018 filed on Nov. 17, 2006 and P2006-114019 filed on Nov. 17, 2006, which are hereby incorporated by reference as if fully set forth herein.

BACKGROUND OF THE INVENTION

1. Field of the Invention

The present invention relates to a low density parity check (LDPC) coding method, and more particularly, to a method of executing LDPC coding using a parity check matrix.

2. Discussion of the Related Art

FIG. 1 is a block diagram of a structure of a mobile communication channel to which a related art or the present invention is applicable. A structure of a mobile communication channel is explained with reference to FIG. 1 as follows.

Referring to FIG. 1, a transmitter undergoes channel coding to transmit data on a wireless channel without loss or distortion. The channel coding includes various schemes such as convolutional coding, turbo coding, LDPC coding, and the like. Data through the channel coding can be transmitted as a single symbol on a wireless channel in a manner that a plurality of bits gather to form the single symbol. In doing so, a procedure for mapping a plurality of bits to a single symbol is called modulation.

The modulated data is transformed into a signal for multiplexed transmission via a multiplexing or multiple access. The multiplexing scheme includes one of various schemes such as CDM, TDM, FDM, and the like. A signal via the multiplexing block is modified to have a structure suitable for being transmitted via multi-antenna and is then delivered to a receiver via a wireless channel. The transmitted data undergoes fading and thermal noise in the course of being carried through the wireless channel. So, the transmitted data may be distorted.

The modulated data is delivered to the receiver via the wireless channel. In this process, the transmitted experiences fading and thermal noise to have distortion possibly. Having received the distorted data, the receiver executes a series of procedures in order reverse to those of the transmitter. In particular, demodulation for transforming the data mapped to the symbol into a bit sequence is carried out. Channel decoding is then executed to reconstruct the distorted data into original data.

A device for performing the channel coding stores a matrix H, which is a parity check matrix for generating parity bits to be added to inputted data (information bits or systematic bits), or a generation matrix (matrix-G) derived from the matrix H therein. Namely, the transmitter includes an encoder that generates parity bits via the matrix-H or the matrix-G and the inputted data. A channel decoding device checks whether the inputted data (systematic bits) are correctly reconstructed or not via the matrix H and logical operations for the received data (distorted systematic bits+parity bits). If the reconstruction fails, the logical operations are re-executed.

The modulation includes one of BPSK (binary phase sift keying), QPSK (quadrature phase shift keying), 16-QAM (quadrature amplitude modulation), 64-QAM, 256-QAM, and the like. For instance, in case of performing modulation, 16-QAM maps a data sequence, which undergoes a channel encoding procedure, to a single symbol by a 4-bit unit. In case of performing demodulation, 16-QAM de-maps a single symbol of data received via a wireless channel to four bits. Data retransmission scheme applicable to the present invention is explained as follows. There are various kinds of data retransmission schemes. Particularly, HARQ (hybrid automatic repeat request) scheme is explained.

First of all, HARQ is the scheme generated from combining a retransmission scheme ARQ (automatic repeat request) with FEC (forward error correction) code. The ARQ is the scheme that a receiver makes a request for retransmission from a transmitter if error is detected from data received by the receiver. The ARQ scheme can be categorized into Stop-And-Wait, Selective Repeat, Go-Back-N, and the like in accordance with a retransmission technique.

Referring to FIG. 2, in the Stop-And-Wait scheme, a transmitter transmits data and then receives an acknowledgement (ACK) message announcing that a receiver successfully has received the data. If so, the transmitter transmits next data. In case of receiving a NACK message announcing that the data was not successfully received by the receiver, the transmitter retransmits the corresponding data.

In the Go-Back-N scheme, a transmitter sends N data first and then receives ACK messages in turn from a receiver. FIG. 3 shows a case that N is 7. In this case, the number (N) of data sent without receiving ACK is called a window size. In case of receiving a NACK message for a $k^{th}$ data, the transmitter sequentially transmits data from the $k^{th}$ data.

FIG. 4 shows the Selective Repeat scheme. In the Selective Repeat scheme, like the Go-Back-N scheme, data is transmitted by setting a window size to N without receiving ACK or NACK message. And, retransmission is selectively carried out on the data of which NACK message has been received only.

In the above-explained HARQ scheme, in case of performing retransmission by the ARQ scheme, previously data and retransmitted data are combined together and then reconstructed by FEC code. In accordance with a technique for combining the two kinds of data, the HARQ scheme is categorized into Chase combining and Incremental Redundancy. The Chase Combining, as shown in FIG. 5, is a scheme of raising a success rate of a receiver in receiving data in a manner that transmission data and retransmission data are combined together by a the receiver.

The Incremental Redundancy, as shown in FIG. 6, is a scheme of raising a reception success rate by lowering a code rate of data received by a receiver in a manner of transmitting a portion of coded data unused for a first transmission, unlike the Chase Combining, in case of a retransmission performed by a transmitter.

LDPC Code is explained as follows. Concepts of the LDPC Code are explained.

First, a linear code can be described as a generation matrix G or a check matrix H. The linear code is characterized in that a code is configured to satisfy $Hc^T=0$ for every codeword c. The currently noticeable LDPC code, which is a sort of the linear code, has been proposed first by Gallager in 1962. The LDPC code is characterized in that iterative decoding based on probability is possible in a manner that elements of a parity check matrix mostly consist of zeros and that the number of non-zero elements is set to a number smaller than a code length. In the first proposed LDPC code, a parity check matrix is defined non-systematic and is designed to have a uniformly small weight in rows and columns. Here, the weight means the number of 1s included in a column or row of a matrix.

Since density of non-zero elements in a parity check matrix H of LDPC code is low, it brings a low decoding complexity. Moreover, as decoding performance is better than those of conventional codes, LDPC Code has good performance approximating a theoretical limit of Shannon. Yet, LDPC Code has had difficulty in hardware implementation, attention has not been paid to LDPC Code over past 30 years. In the early 1980's, an iterative decoding method using graphs has been developed. So, various kinds of algorithms capable of decoding LDPC Code using this method have been developed. As a representative algorithm, there is a sum-product algorithm.

Features of LDPC code are explained as follows. The LDPC code has high error correction performance, which enables improvements in communication speed and size. The LDPC coding scheme can be combined with MIMO (multiple input multiple output) system to be applicable to high-speed wireless LAN capable of transmission at several hundreds Mbits/s, high-speed mobile communication having a data rate over 1 Mbits/s at 250 km/h, and optical communication over 40 Gbits/s. Owing to the high error correction performance of the LDPC Code, a quality of transmission is enhanced to enable quantization encrypted communication that reduces a count of retransmissions on a low-quality communication path. Owing to low complexity and outstanding loss compensation of the LDPC Code, a lost or damaged packet can be easily reconstructed, which enables contents having the same quality of TV to be transmitted via Internet or mobile communication. Owing to the wide application range and the large size of LDPC, it is now possible to implement 10 GBASE-T up to a range of 100 m, which was considered impossible, through the LDPC Code. Simultaneously, it is able to extend a transmission capacity of a single satellite transmitter of 36 MHz band up to 1.3 times increased, i.e., 80 Nbits/s.

A structured LDPC coding scheme is explained as follows.

First, a parity check matrix H is used to use LDPC Code. Most elements of the used matrix H consist of zeros and the rest consist of 1s. Since a size of the matrix H s over $10^5$ bits, a large-size memory is required for representing the matrix H. The structured LDPC scheme is to represent elements of the matrix H used for LDPC encoding/decoding as a sub-block having a predetermined size as shown in FIG. 7. In IEEE802.16e, the sub-block is represented as a single integer index to reduce a size of memory required for storing the matrix H. The sub-block can include one of various matrixes. For instance, the sub-block can include a permutation matrix having a predetermined size.

If the structured LDPC scheme is employed, a single integer (i.e., index) is just stored in a specific memory instead of storing a matrix having a predetermined size with 1s and 0s therein. Hence, it is able to reduce a size of memory required for representing the matrix H.

For instance, if a size of codeword reflected on IEEE802.16e standard is 2,304 and if a code rate is ⅔, a model matrix used for LDPC encoding/decoding can be represented as FIG. 8. The model matrix means a parity check matrix consisting of at least one sub-block represented as a shift number that will be explained later. The model matrix can be expanded into a party check matrix by the following matrix. Hence, the meaning of executing encoding/decoding with a specific model matrix indicates that encoding/decoding is executed using a parity check matrix expanded from the corresponding model matrix.

The structure LDPC matrix, as shown in FIG. 8, can be represented as '−1', '0' and a positive number. If an index is '−1', it indicates a zero matrix having a specific size. If an index is '0', it indicates an identity matrix having a specific size. And, an index having a positive number except '−1' and '0' indicates a shift number. If a sub-block is represented as an index '1', the corresponding sub-block is configured by being shifted '1' time in a specific direction from an identity matrix.

FIG. 9 is a diagram for a method of representing a matrix in accordance with the index, i.e., the shift number. When a specific parity check matrix is structured into a 4×4 matrix (i.e., sub-block), if the specific sub-block is represented as an index '3', the sub-block becomes the matrix shown n FIG. 9.

A method of LDPC coding is explained as follows.

In general LDPC encoding, a generation matrix G is derived from a parity check matrix H and then information bits are encoded. In order to derive the generation matrix G, the parity check matrix H is configured into $[P^T:I]$ by Gaussian Reduction. Assuming that the number of the information bits is set to k and assuming that a size of encode codeword is set to n, the matrix P is a matrix of which number of rows is k and of which number of columns is (n−k). And, the matrix I is an identity matrix of which a row size if k and of which column size is k.

If the generation matrix G is represented as $[P^T:I]$, it becomes [I:P] matrix. If k-bit information bits to be encoded are represented as a matrix, they can be represented as a matrix x of which number of row is 1 and of which number of columns is k. In this case a codeword c can be represented as a following Equation.

$$c=xG=[x:xP] \quad \text{[Equation 1]}$$

In Equation 1, 'x' indicates an information part or a systematic part and 'xp' indicates a parity part.

Meanwhile, in case that encoding is executed by Gaussian Reduction, a calculation amount is considerably large. So, instead of deriving the matrix G by designing a form of the matrix H into a special structure, the matrix H is directly encoded into the matrix G. In particular, if Equation 1 is multiplied by $H^T$ using a feature that a product of the matrix G and a transposed matrix $H^T$ of the matrix H is 0 (i.e., $GH^T=0$), Equation 2 can be obtained. Hence, it is able to obtain a codeword c by adding a parity bit coinciding with Equation 2 behind an information bit (x).

$$cH^T=xGH^T=[x:xP][P^T:I]^T=0 \quad \text{[Equation 2]}$$

In a communication system, encoded data contains noise in the course of passing through the wireless channel shown in FIG. 1. And, a receiver has a data decoding process by the procedure shown in FIG. 10. A decoding block of the receiver finds information bits (x) from a received signal (c') having noise added to an encoded codeword (c) using the feature of $cH^T=0$. In particular, assuming that a received codeword is c', a value of $c'H^T$ is calculated. If a corresponding result is 0, first k bits of c' are decided as the information bits (x). If a value of $c'H^T$ is not 0, the information bits (x) are reconstructed by finding c' that satisfies $c'H^T=0$ using a decoding scheme such as sum-product algorithm through a graph and the like.

A code rate of LDPC code is explained as follows.

Generally, if a size of the information bits is k and if a size of a codeword actually transmitted is n, a code rate (R) can be represented as follows.

$$R=k/n \quad \text{[Equation 3]}$$

If row and column sizes of the matrix H necessary for LDPC encoding/decoding are m and n, respectively, a code rate can be represented as follows.

$$R=1-m/n \quad \text{[Equation 4]}$$

As mentioned in the foregoing description, the related art LDPC code performs encoding/decoding by the matrix H. So, a structure of the matrix H is very important. In particular, since performance of encoding/decoding is considerably affected by the structure of the matrix H, a design of the matrix H is important more than anything else.

In case of performing retransmission by the IR scheme, a code rate of an initial transmission should differ from that of a retransmission. In order to apply the different code rates, different model matrixes may be used. If so, there rises a problem that the IR scheme may not be supported. For instance, in case that a first model matrix used for an initial transmission differs from a second model matrix used after reception of NACK signal, a parity bit generated from the first model matrix is different from that generated from the second model matrix. Hence, a combined reception by a receiver is impossible.

SUMMARY OF THE INVENTION

Accordingly, the present invention is directed to a method of executing LDPC coding using a parity check matrix that substantially obviates one or more problems due to limitations and disadvantages of the related art.

An object of the present invention is to provide an LDPC coding method, by which various H-ARQ schemes are supported.

Another object of the present invention is to provide a model matrix having enhanced performance.

A further object of the present invention is to provide a retransmission scheme that uses a model matrix having enhanced performance.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of performing LDPC coding using a parity check matrix according to one embodiment of the present invention comprises providing an information bit stream for channel encoding, and encoding the information bit stream by using a first parity check matrix including at least one row generated by combining at least two rows of a second parity check matrix.

In another aspect of the present invention, a method of performing LDPC coding using a parity check matrix comprises providing an information bit stream for channel encoding, and encoding the information bit stream by using a first parity check matrix including at least two rows generated by splitting a row of a second parity check matrix.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 12 is a diagram of a mother matrix used for one embodiment of the present invention;

FIG. 13A is a diagram of an example of two rows in which elements having weights in an information part are not overlapped in a column direction;

FIG. 13B is a diagram of an example of two rows in which elements having no weight in an information part are overlapped in a column direction;

FIGS. 14 to 17 are exemplary diagrams for combinations of rows not overlapped in the model matrix shown in FIG. 12;

FIG. 18 is a diagram of a model matrix used for LDPC decoding at a code rate ⅚;

FIG. 19 is an exemplary diagram for a model matrix used for a receiver to decode data retransmitted;

FIG. 20 is a diagram of an example that a single row of the model matrix shown in FIG. 12 is split into two rows;

FIG. 21 is a diagram of an example that a single row of the model matrix shown in FIG. 20 is split into two rows;

FIG. 22 is a diagram of an example that a single row of the model matrix shown in FIG. 21 is split into two rows;

FIG. 23 is a diagram of an example that a single row of the model matrix shown in FIG. 22 is split into two rows;

FIG. 24 is a diagram of a new equivalent matrix having rows or columns switched from each other according to a second embodiment of the present invention;

FIG. 25 is a diagram of a new equivalent matrix having rows or columns switched from each other according to the second embodiment of the present invention;

FIG. 26 is a diagram of a new equivalent matrix having rows or columns switched from each other according to the second embodiment of the present invention;

FIG. 27 is a diagram of a new equivalent matrix having rows or columns switched from each other according to the second embodiment of the present invention;

FIG. 28 is a diagram of a new equivalent matrix having rows or columns switched from each other according to the second embodiment of the present invention;

FIG. 29 is a diagram of a new equivalent matrix having rows or columns switched from each other according to the second embodiment of the present invention;

FIG. 30 is a diagram of a model matrix equivalent to the model matrix shown in FIG. 12; and FIG. 31 is a diagram of an example for a model matrix used for a receiver to decode retransmitted data.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Generally, two kinds of methods have been proposed to support the IR (incremental redundancy) scheme for LDPC Code.

In the first method, at least one of an information bit and a parity bit included in LDPC codeword generated by LDPC coding is punctured. Preferably, the puncturing scheme is performed on the parity bit. If the puncturing scheme is performed, it is able to adjust a code rate. In particular, since a code rate is determined in accordance with Equation 4, a high code rate can be obtained from performing more puncturing or a low code rate can be obtained from performing less puncturing. Hence, the IR scheme can be carried out using these features.

Figure 1:
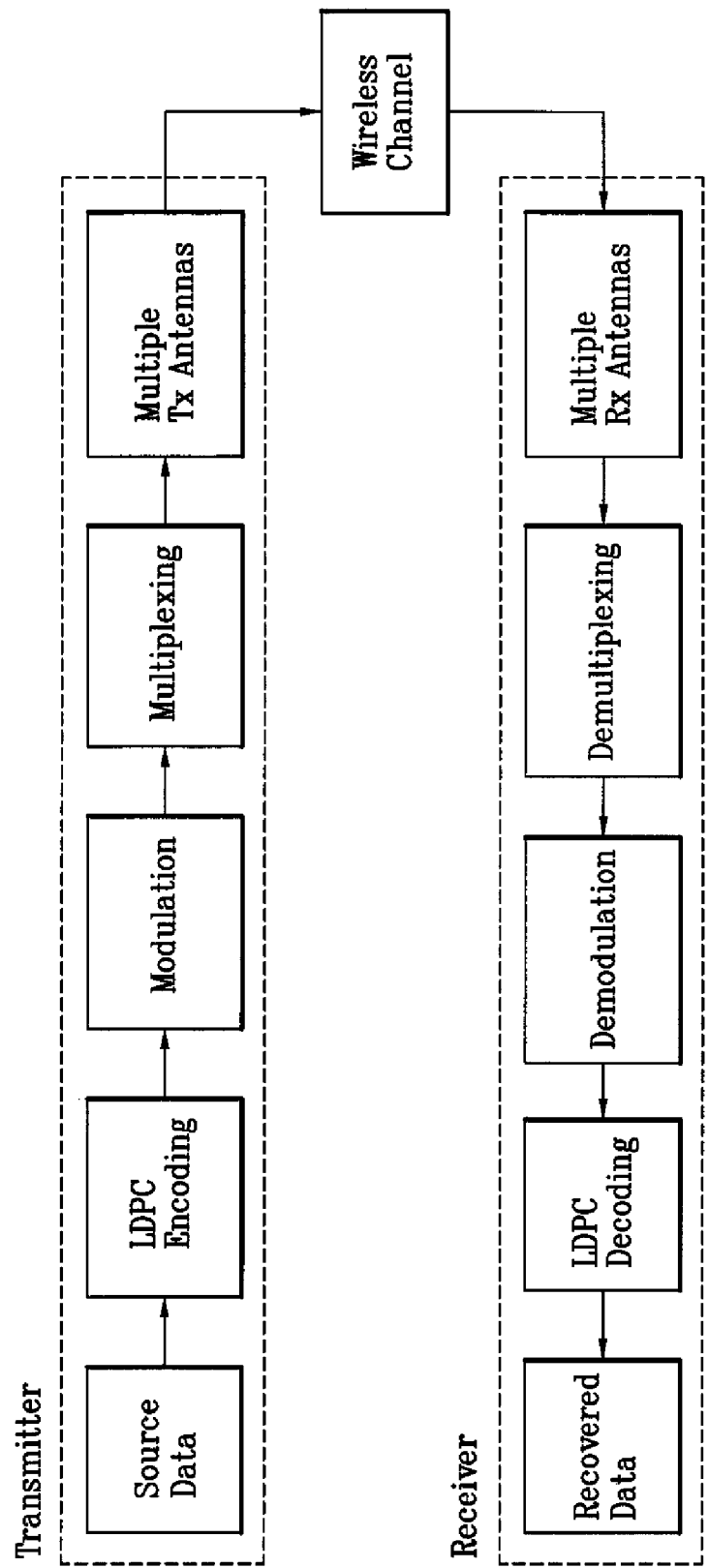
FIG. 1 is a block diagram of a structure of a mobile communication channel to which a related art or the present invention is applicable.
Figure 2:
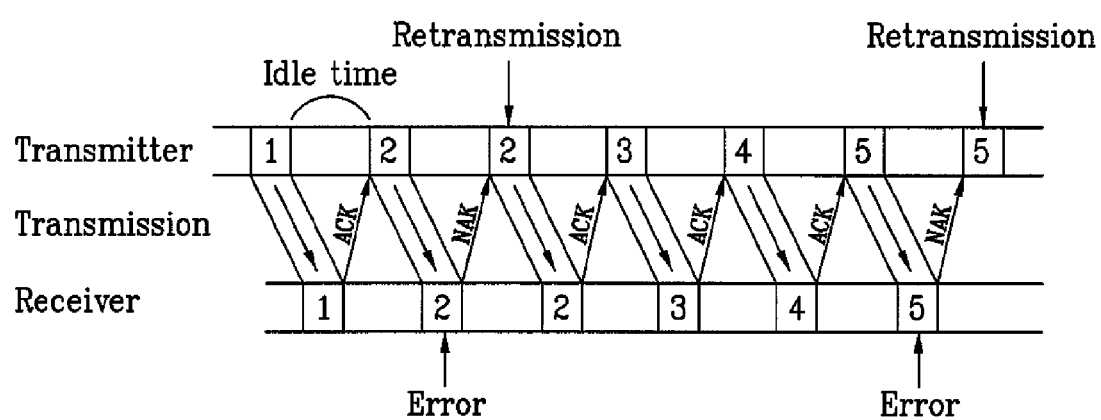
FIGS. 2 to 4 are diagrams for retransmission schemes according to a related art.
Figure 3:
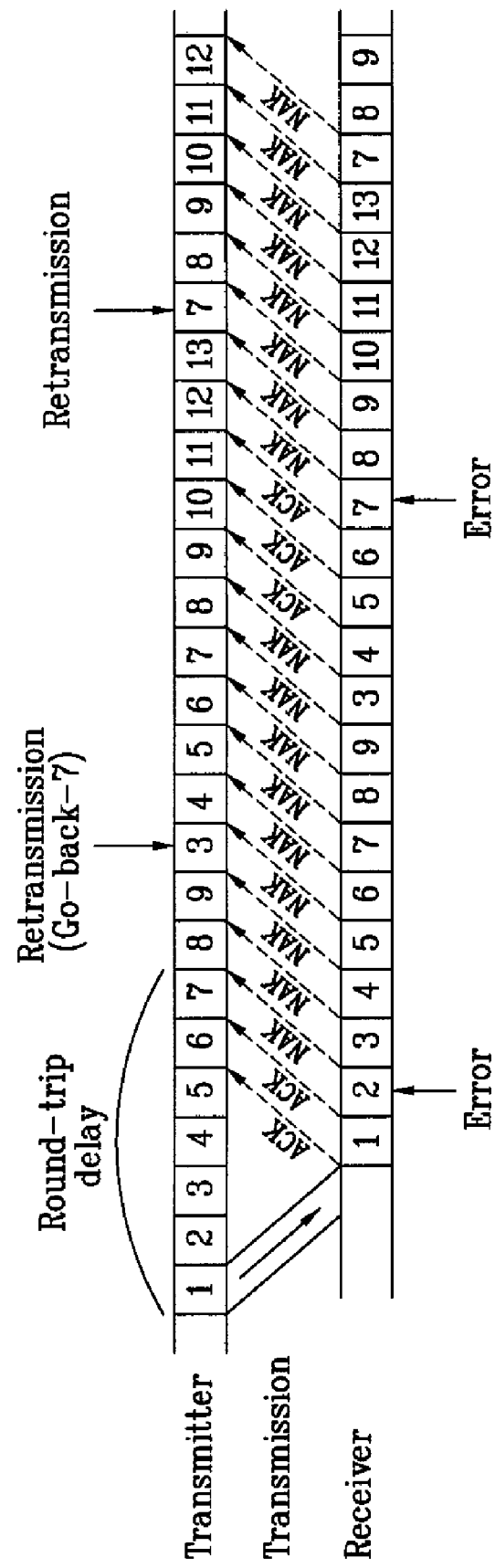
Figure 4:
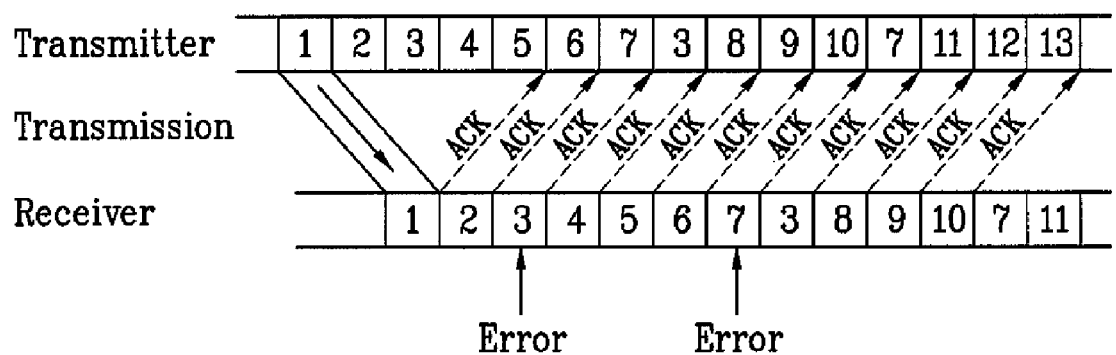
Figure 5:
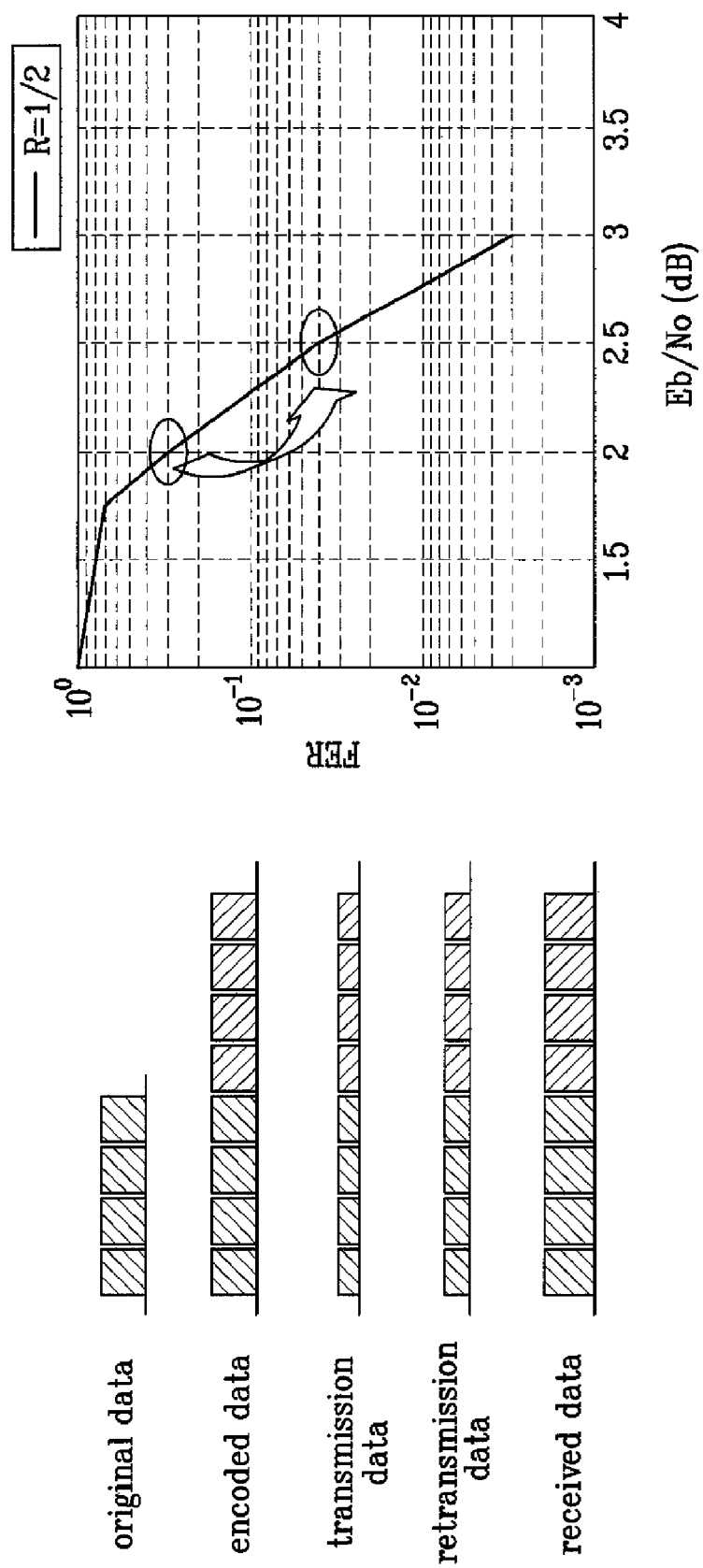
FIG. 5 and FIG. 6 are diagrams for retransmission schemes according to a related art and the present invention.
Figure 6:
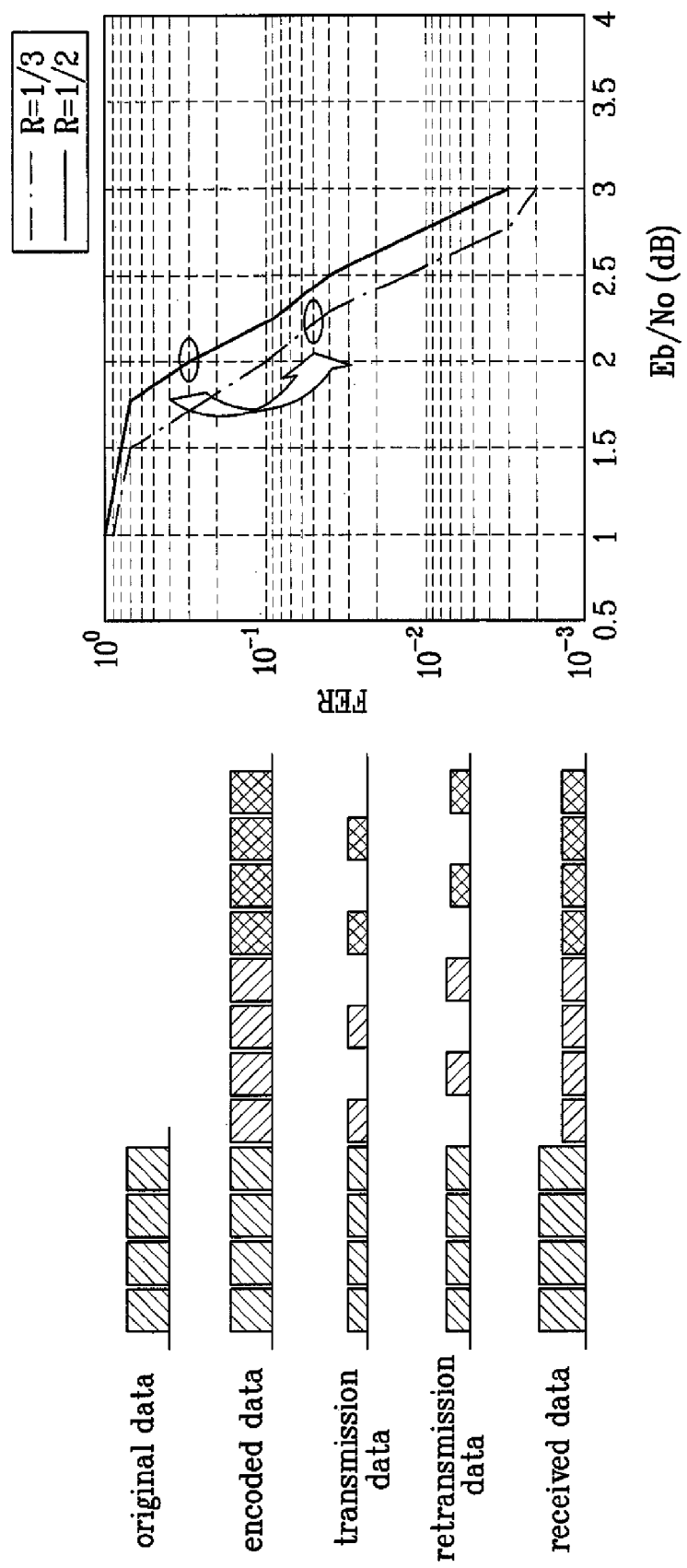
Figures 7, 8, 9:
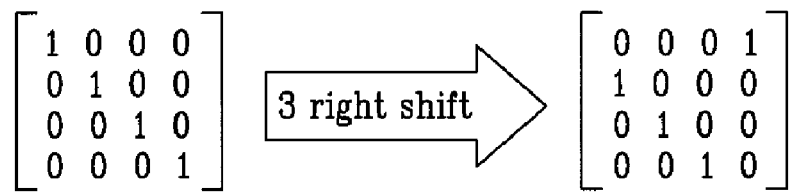
FIG. 7 is a diagram for a concept of a sub-block on a parity check matrix.
FIG. 8 is a diagram of an example of a model matrix proposed by a related art.
FIG. 9 is a diagram for a representation of a matrix in accordance with an index, i.e., a shift number.
Figure 10:
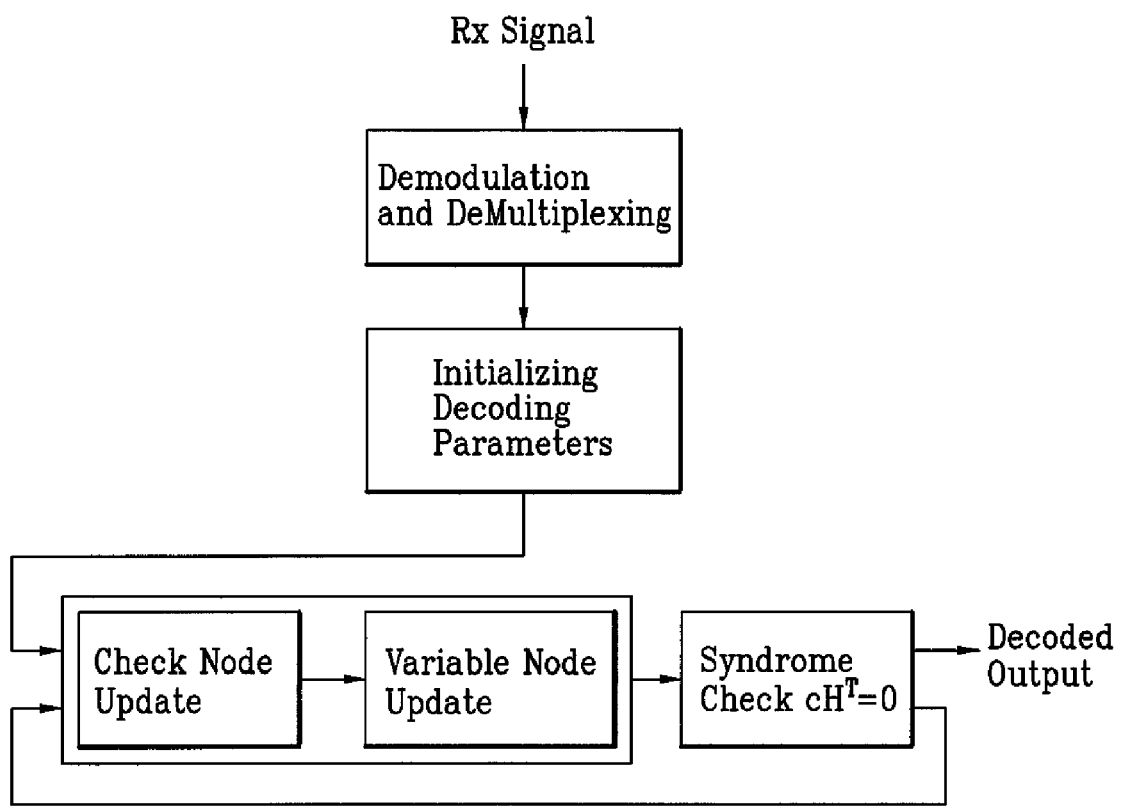
FIG. 10 is a block diagram for LDPC decoding according to a related art and the present invention.
Figure 11A:
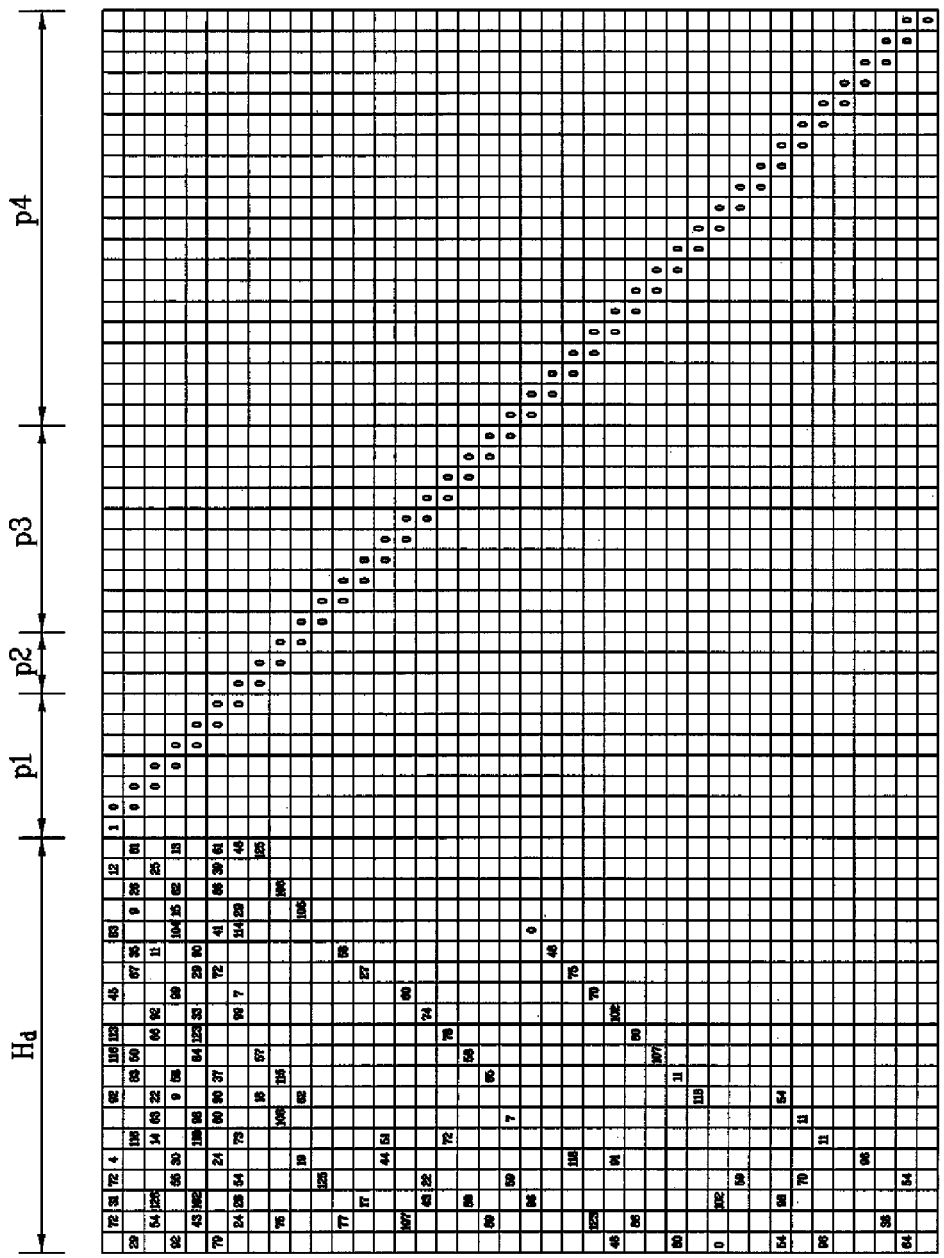
FIG. 11A is a diagram of an example for a model matrix used by second method to support the IR scheme.
Figure 11B:
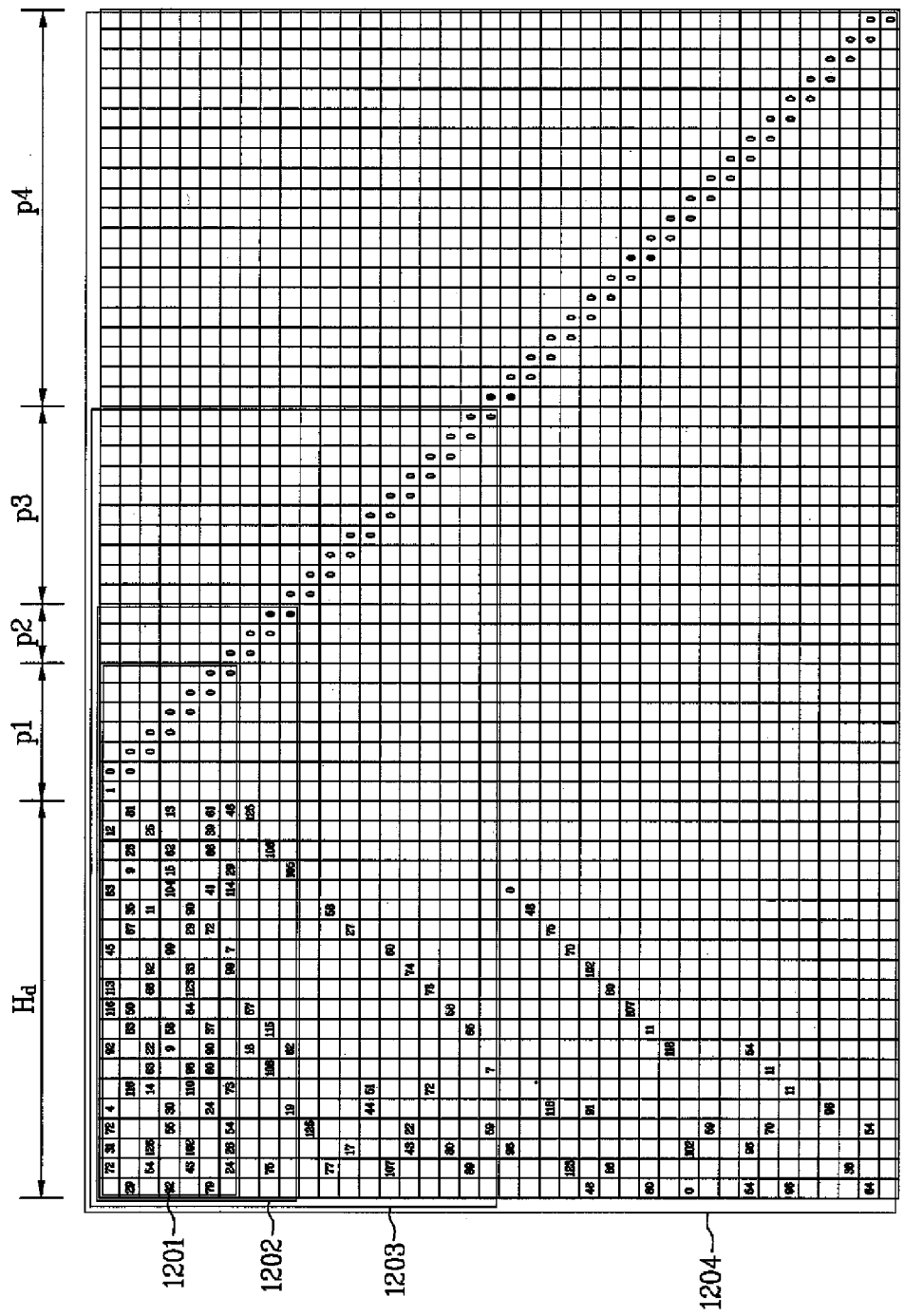
FIG. 11B is a block diagram for a method of using a single mother matrix cut into several parts in accordance with a code rate.

In the second method for supporting the IR scheme, a mother matrix is divided to be used for coding. FIG. 11A shows an example of a mother matrix used by the second method for supporting the IR scheme. A single mother matrix can be divided into several matrixes as shown in FIG. 11B. FIG. 11B is a block diagram for a method of using a single mother matrix divided into several matrixes in accordance with a code rate. Referring to FIG. 11B, a single mother matrix can be divided into several matrixes to be used. Each of the matrixes supports a specific code rate.

A transmitter according to the second method is able to perform communication in accordance with a specific code rate by dividing the model matrix shown in 11A into the matrixes shown in FIG. 11B. The following embodiments relate to a separate method distinguished from the first or second method.

First Embodiment

According to a first embodiment of the present invention, a plurality of rows of a mother matrix are combined together to generate a new parity check matrix. Preferably, elements having weights in an information part of the combined rows are not overlapped with each other in a column direction. If a plurality of rows of the mother matrix are combined into a single row, a new model matrix can be generated. A plurality of newly generated matrixes correspond to a plurality of code rates. Hence, the IR scheme can be supported.

FIG. 12 is a diagram of a mother matrix used for one embodiment of the present invention. A matrix shown in FIG. 12 is a model matrix and an index indicated in each sub-block of the matrix indicates a shift number. A sub-block having no shift number in FIG. 12 is a sub-block having an index '−1'. In particular, a sub-block failing to indicate a shift number represents a zero matrix. As shown in FIG. 12, the model matrix is constructed with eight rows and twenty-eight columns. By Equation 4, the model matrix shown in FIG. 12 supports a code rate $20/28$.

The model matrix shown in FIG. 12 consists of an information part corresponding to information bits and a parity part corresponding to parity bits. In FIG. 12, the information part includes columns indicated by indexes 0 to 19, i.e., by $0^{th}$ column to $19^{th}$ column. In FIG. 12, the parity part includes columns indicated by indexes 20 to 27, i.e., by $20^{th}$ column to $27^{th}$ column. Rows combined according to the first embodiment of the present invention are characterized in that elements having weights in the information part are not overlapped with each other. In other words, non-zero elements of the information part in the plurality of the combined rows are unable to lie on the same column.

FIG. 13A is a diagram of an example of two rows in which elements having weights in an information part are not overlapped in a column direction. A pair of rows in FIG. 13A are the rows 1201 and 1202 in FIG. 12A. A sub-block failing to indicate a shift number in FIG. 13A is a sub-block having an index '−1'. Although a first column of the row 1201 in FIG. 13A has a shift number '10', a first column of the row 1202 has an index '−1'. If all elements of the rows 1201 and 1202 in the information part ($0^{th}$ column to $19^{th}$ column) are compared, the elements having weights in a column direction are not overlapped. In a parity part, elements having weights can be overlapped in the column direction.

Referring to FIG. 13A, it is observed that the shift number '117' in the parity part are overlapped in the column direction. If the rows 1201 and 1202 shown in FIG. 13A are combined according to the first embodiment of the present invention, a row 1301 can be obtained.

Figure 13B:
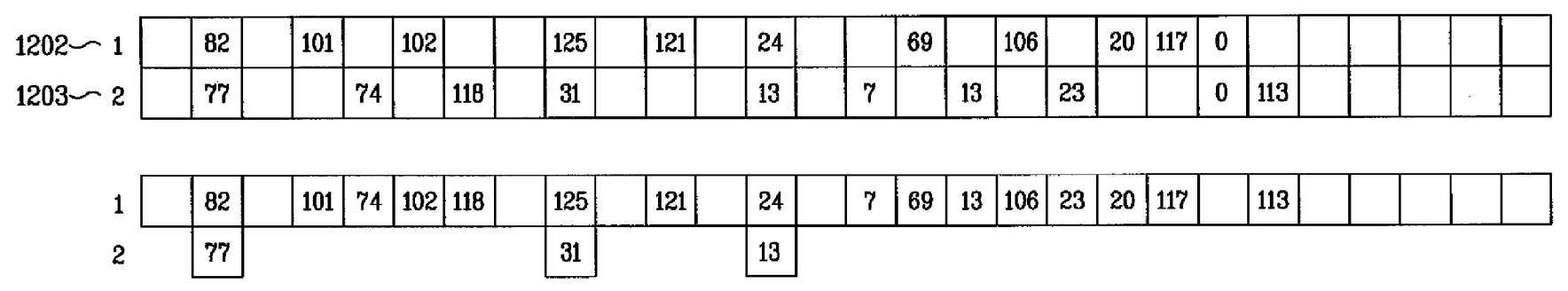

FIG. 13B is a diagram of an example of two rows in which elements having no weight in an information part are overlapped in a column direction. A pair of rows in FIG. 13B are the rows 1202 and 1203 in FIG. 13A. A sub-block failing to indicate a shift number in FIG. 13B is a sub-block having an index '−1'. Although a second column of the row 1202 in FIG. 13B has a shift number '82', a first column of the row 1203 has an index '77'. If all elements of the rows 1201 and 1202 in the information part ($0^{th}$ column to $19^{th}$ column) are compared, the elements having weights in the column direction are overlapped. Namely, the column weight of the row 1202 or 1203 exceeds '1'. Hence, it is unable to combine the rows 1202 and 1203 according to the first embodiment of the present invention.

A method of generating a new model matrix by combining non-overlapped rows in the model matrix shown in FIG. 12 together is explained as follows. FIGS. 14 to 17 are exemplary diagrams for combinations of rows not overlapped in the model matrix shown in FIG. 12.

Referring to FIG. 14, a row 1301 is generated by combining rows 1201 and 1202 in FIG. 12. As a result of combining the rows 1201 and 1202, FIG. 14 supports a code rate of $20/27$. In particular, a code rate higher than the code rate shown in FIG. 12 is supported. According to the example shown in FIG. 14, it can be observed that various code rates are supportable without puncturing.

In FIG. 15, a row 1302 is generated from combining the rows 1203 and 1204 together. As a result of combining the rows 1203 and 1204, FIG. 15 supports a code rate $20/26$. Namely, it supports a code rate higher than that of FIG. 12 or FIG. 14.

In FIG. 16, a row 1303 is generated from combining the rows 1205 and 1206 together. As a result of combining the rows 1205 and 1206, FIG. 16 supports a code rate $4/5$. Namely, it supports a code rate higher than that of FIG. 14 or FIG. 15.

Referring to FIG. 17, a row 1304 is generated from combining the rows 1207 and 1208 in FIG. 16 together. As a result of combining the rows 1207 and 1208, FIG. 17 supports a code rate $5/6$. Namely, FIG. 17 supports a highest code rate.

A transmitter according to the first embodiment of the present invention performs channel encoding using a mother matrix proposed by the first embodiment and then generates 'coded blocks' 0 to 27. A coded blocks means that information bits or parity bits corresponding to each of 28 columns of the model matrix are grouped. In particular, the coded blocks 0 to 27 correspond to a single LDPC codeword. And, a coded block corresponding to an information part is named 'information block' and a coded block corresponding to a parity part is named 'parity block'.

Model matrixes shown in FIGS. 12 to 17 are examples generated from the combinations of rows according to the first embodiment of the present invention. Accordingly, a transmitter or receiver stores a single model matrix and then freely designs the model matrixes shown in FIGS. 12 to 17 in accordance with row combinations proposed by the first embodiment. For instance, the transmitter or receiver keeps storing a matrix shown in FIG. 12 only and is then able to transform the matrix shown in FIG. 12 into one of the matrixes shown in FIGS. 13 to 17 in accordance with a variation of a code rate. Alternatively, a model matrix can be pre-generated by row combinations from the model matrix and stored in the transmitter or receiver, Thereafter, the transmitter or receiver can use the stored model matrix to encode data.

A first IR scheme according to the first embodiment of the present invention is explained as follows.

First of all, a transmitter is able to perform encoding using a model matrix shown in FIG. 12. If encoding is performed using the model matrix shown in FIG. 12, encoded blocks corresponding to 28 columns are generated. In other words, 20 block corresponding to the columns 0 to 19 become information blocks and 8 blocks corresponding to the columns 20 to 27 become parity blocks.

In this case, the transmitter can decide to perform an initial transmission at a code rate $5/6$ based on various kinds of information. In doing so, the transmitter generates an LDPC codeword including information blocks corresponding to the columns 0 to 19 and parity blocks corresponding to the columns 21, 23, 25 and 27 and then transmits the generated LDPC codeword to a receiver. In particular, it is able to support the code rate $5/6$ by transmitting 20 information blocks and 4 parity blocks. Since a currently used code rate is $5/6$, the receiver according to the first embodiment performs LDPC decoding using a matrix model shown in FIG. 18.

The model matrix shown in FIG. 18 is the model matrix used for LDPC decoding if a code rate is $5/6$. The matrix shown in FIG. 18 is generated from eliminating columns having no weights from the matrix shown in FIG. 17. In particular, the matrix shown in FIG. 18 is generated from eliminating columns 20, 22, 24 and 26 from the matrix shown in FIG. 17. The model matrix shown in FIG. 18 is generated from selecting some columns from the model matrix shown in FIG. 17. After the decoding has been performed using the model matrix shown in FIG. 18, if the decoding fails, the receiver transmits negative reception acknowledgement (NACK) to the transmitter.

Having received the NACK, the transmitter performs a retransmission by lowering the code rate. For instance, the transmitter is able to perform the retransmission in accordance with the model matrix shown in FIG. 15. In this case, parity blocks corresponding to the columns 24 and 26 are additionally generated. In case of performing the retransmission, the transmitter can transmit the additionally generated parity bits only. In particular, the transmitter is able to transmit the parity blocks corresponding to the columns 24 and 26 to the receiver.

Having received the parity blocks corresponding to the columns 24 and 26, the receiver performs decoding by combining them with the initially transmitted data. In this case, since the code rate is $20/26$, the receiver is able to perform decoding using the model matrix shown in FIG. 19.

The model matrix shown in FIG. 19 is an example of a model matrix used for the receiver to decode the retransmitted data. The receiver performs decoding in a manner of combining the additionally received parity blocks corresponding to the columns 24 and 26, the previously stored information blocks corresponding to the columns 0 to 19, and parity blocks corresponding to the columns 21, 23, 25 and 27.

If the decoding at the code rate $20/26$ fails, the receiver transmits NACK to the transmitter. In this case, the transmitter re-performs encoding at a code rate $20/27$. In this case, a parity block corresponding to the column 22 shown in FIG. 14 is additionally generated. So, the transmitter additionally retransmits the parity block corresponding to the column 22 only.

The receiver performs decoding in a manner of combining the retransmitted parity block corresponding to the column 22, the previously stored information blocks corresponding to the columns 0 to 19, and the parity blocks corresponding to the columns 21, 23, 24, 25, 26 and 27.

In the above-explained example, the initial transmission is carried out at the code rate $5/6$. If NACK is received, the retransmission is carried out at the code rate $20/26$. If the NACK is received again, the retransmission is carried out at the code rate $20/27$. And, as the code rate varies, the additionally generated parity block(s) is retransmitted in addition.

A second IR scheme according to the first embodiment of the present invention is explained as follows.

First of all, an initial transmission can be carried out at a code rate $5/6$ for example. In particular, data are transmitted in accordance with the model matrix shown in FIG. 17. If encoding is carried out in accordance with the model matrix shown in FIG. 17, encoded blocks corresponding to the columns 0 to 27 shown in FIG. 17 are generated. In this case, a transmitter generates an LDPC codeword including information blocks corresponding to the columns 0 to 19 and parity blocks corresponding to the columns 21, 23, 25 and 27 and then transmits the generated LDPC codeword to a receiver.

Since the currently code rate is $5/6$, the receiver performs LDPC decoding using the model matrix shown in FIG. 18. The model matrix shown in FIG. 18 is the model matrix used for LDPC decoding in case that a code rate is $5/6$. The matrix shown in FIG. 18 is generated from eliminating columns having no weights from the matrix shown in FIG. 17. In particular, the columns 20, 22, 24 and 26 are eliminated from the matrix shown in FIG. 17 to generate the model matrix shown in FIG. 18.

Meanwhile, after the decoding has been performed using the model matrix shown in FIG. 18, if the decoding fails, the receiver transmits NACK to the transmitter. Having received the NACK, the transmitter performs a retransmission by lowering a code rate. For instance, the retransmission can be carried out at a code rate $20/26$. In particular, the transmitter is able to perform the decoding in accordance with the model matrix shown in FIG. 15. In this case, parity blocks corresponding to the columns 24 and 26 are additionally generated. In case of performing the retransmission, the transmitter can transmit the additionally generated parity bits only. In particular, the transmitter is able to transmit the parity blocks corresponding to the columns 24 and 26 to the receiver.

Having received the parity blocks corresponding to the columns 24 and 26, the receiver is able to perform decoding by combining them with the initially transmitted 24 data. In this case, since the code rate is $20/26$, the transmitter is able to perform decoding using the model matrix shown in FIG. 19. The model matrix shown in FIG. 19 is an example of a model matrix used for the receiver to decode the retransmitted data. The receiver performs decoding in a manner of combining the additionally received parity blocks corresponding to the columns 24 and 26, the previously stored information blocks corresponding to the columns 0 to 19, and parity blocks corresponding to the columns 21, 23, 25 and 27.

If the decoding at the code rate $20/26$ fails, the receiver transmits NACK to the transmitter. In this case, the transmitter re-performs encoding at a code rate $20/27$. In this case, a parity block corresponding to the column 22 shown in FIG. 14 is additionally generated. So, the transmitter additionally retransmits the parity block corresponding to the column 22 only.

The receiver performs decoding in a manner of combining the retransmitted parity block corresponding to the column 22, the previously stored information blocks corresponding to the columns 0 to 19, and the parity blocks corresponding to the columns 21, 23, 24, 25, 26 and 27.

In the above-explained example, the initial transmission is carried out at the code rate $5/6$. If NACK is received, the retransmission is carried out at the code rate $20/26$. If the NACK is received again, the retransmission is carried out at the code rate $20/27$. And, as the code rate varies, the additionally generated parity block(s) is retransmitted in addition.

The model matrixes proposed according to the present embodiment are just exemplary for explaining the present invention, by which implementations of the present invention are not limited. Detailed code rates, the retransmission receptions and the like used in explaining the present embodiment are just exemplary to explain the present embodiment only, by which implementations of the present invention are not limited. And, the model matrixes according to the present embodiment are applicable to various communication schemes as well to the retransmission.

Second Embodiment

A second embodiment of the present invention relates to a method of generating a new matrix by splitting at least one row included in a specific mother matrix into at least two rows. The row to be split is split into a plurality of rows. Encoding can be carried out in a manner of changing a sequence of rows of a new mother matrix including the split rows or a sequence of columns of the new mother matrix.

According to the second embodiment of the present invention, new model matrixes are generated using a scheme of splitting a row into a plurality of rows. Since the new model matrixes generated according to the second embodiment of the present invention support a plurality of code rates, the method according to the second embodiment of the present invention can support various code rates without employing the puncturing scheme. And, the IR scheme is applicable based on the various code rates as well.

A method of splitting a row into a plurality of rows according to the second embodiment of the present invention is explained as follows.

TABLE 1A

| 1 | 0 | 1 | 1 | 1 | 0 | 0 | 1 | 1 | 0 | 0 | 1 | 1 | 0 | 0 |

TABLE 1B

| 0 | 0 | 1 | 0 | 1 | 0 | 0 | 0 | 1 | 0 | 0 | 0 | 1 | 1 | 0 |
| 1 | 0 | 0 | 1 | 0 | 0 | 0 | 1 | 0 | 0 | 0 | 1 | 0 | 1 | 0 |

It is able to split a row shown in Table 1A into two rows shown in Table 1B. The row shown in Table 1A has fifteen columns and $1^{st}$, $3^{rd}$, $4^{th}$, $5^{th}$, $8^{th}$, $9^{th}$, $12^{th}$, and $13^{th}$ elements among the columns have a weight.

In case that a single row is split into a plurality of rows according to the second embodiment of the present invention, one of a plurality of the rows has the weight at a position where a weight of the previous row has existed. In particular, the first row shown in Table 1B has weights on the $3^{rd}$, $5^{th}$, $9^{th}$ and $13^{th}$ elements, respectively. And, the second row shown in Table 1B has weights on the $1^{st}$, $4^{th}$, $8^{th}$ and $12^{th}$ elements, respectively. In brief, in case that the row is split according to the second embodiment, the elements having the weights in the previous row before the split are exclusively distributed to the split rows.

Meanwhile, even if no element of a row before the split has a weight, rows after the spit can have weights. In the row shown in Table 1A, $14^{th}$ element has no weight. Yet, each of the two rows split according to the second embodiment shown in Table 1B can have a weight on its $14^{th}$ element. In case that a plurality of split rows have weights on the same position, if a sum of the weights of a corresponding column is an even number, it can be ignored by a modulo operation. Hence, they can have weight. Namely, if a sum of weights of an even column becomes an even number, a plurality of the rows split according to the second embodiment can have weight although the row before the split did not have weight.

Consequently, in case that a row is split according to the second embodiment, elements having weights in the row before the split are exclusively distributed to a plurality of the split rows. Moreover, in case that a row is split into a plurality of rows according to the second embodiment, it is able to adjust elements of each of the split rows to have a sum of weights of an even column.

TABLE 2A

| A | | B | | | C | | D | E | |
|---|---|---|---|---|---|---|---|---|---|
| 1 | 0 | 1 | 0 | 0 | 1 | 0 | 1 | 0 | 0 |

Table 2A shows a single row that is not split yet. And, 'A', 'B', 'C', 'D', and 'E' are variables corresponding to $1^{st}$, $3^{rd}$, $6^{th}$, $8^{th}$, and $9^{th}$ columns, respectively. In accordance with a structure of the row shown in Table 2A, the variables A, B, C and D should satisfy the relation represented as Equation 5.

$$A+B+C+D=0(\mathrm{mod}\ 2) \qquad \text{[Equation 5]}$$

TABLE 2B

| A | | B | | | C | | D | E | |
|---|---|---|---|---|---|---|---|---|---|
| 1 | 0 | 0 | 0 | 0 | 1 | 0 | 0 | 1 | 0 |
| 0 | 0 | 1 | 0 | 0 | 0 | 0 | 1 | 1 | 0 |

Table 2B shows two rows split according to the second embodiment of the present invention. And, 'A', 'B', 'C', 'D', and 'E' are variables corresponding to $1^{st}$, $3^{rd}$, $6^{th}$, $8^{th}$, and $9^{th}$ columns, respectively. Moreover, $1^{st}$, $3^{rd}$, $6^{th}$ and $8^{th}$ elements are exclusively distributed to the two rows shown in Table 2B in accordance with the above-explained rule of the second embodiment. The two rows shown in Table 2B have weights in a manner that a sum of weights of a column becomes an even number at the same position ($9^{th}$ position) in accordance with the rule of the second embodiment.

In this case, the variables A, B, C, D and E should satisfy the following Equation in accordance with a structure of the rows shown in Table 2B.

$$A+C=E(\mathrm{mod}\ 2)$$

$$B+D=E(\mathrm{mod}\ 2) \qquad \text{[Equation 6]}$$

In this case, if the respective Equations shown in Equation 6 are added, a relation of '$A+B+C+D=2E(\mathrm{mod}\ 2)=0$' is established. Hence, it is also able to obtain Table 2A through Table 2B. Namely, even if the row is split according to the second embodiment, solutions prior to the split are not changed. Through the above Equation, even if a row of a parity check matrix is split in accordance with the second embodiment, it can be observed that a previous solution is not changed. Hence, a codeword corresponding to a solution, which satisfies a check Equation 'Hc$^T$=0' by a non-split parity check matrix, satisfies a check Equation 'H'c'$^T$=0' by a parity check matrix split according to the second embodiment.

FIG. 20 is a diagram of an example that a single row of the model matrix shown in FIG. 12 is split into two rows. A row 504 shown in FIG. 12 is split into rows 504A and 504B shown in FIG. 20. In this case, it can be observed that elements having weights on $0^{th}$ to $23^{rd}$ columns are exclusively distributed. And, it can be observed that a shift number '127' is added to a $24^{th}$ column. In this case, since a sum of weights of the $24^{th}$ column is an even number, a corresponding influence can be ignored by a modulo operation. Hence, it can be observed that the model matrix shown in FIG. 20 is an equivalent matrix to the model matrix shown in FIG. 12. Meanwhile, row and column numbers of the matrix shown in FIG. 20 are incremented by 1 each, the matrix shown in FIG. 20 supports a code rate ⅘. From the example shown in FIG. 20, it can be observed that various code rates are supportable without puncturing.

FIG. 21 is a diagram of an example that a single row of the model matrix shown in FIG. 20 is split into two rows. A row 503 shown in FIG. 20 is split into rows 503A and 503B shown in FIG. 21. In this case, it can be observed that elements having weights on $0^{th}$ to $23^{rd}$ columns are exclusively distributed. And, it can be observed that a shift number '119' is added to a $25^{th}$ column. In this case, since a sum of weights of the $25^{th}$ column is an even number, a corresponding influence can be ignored by a modulo operation. Hence, it can be observed that a model matrix shown in FIG. 21 is an equivalent matrix to the model matrix shown in FIG. 12 or FIG. 20. Meanwhile, row and column numbers of the matrix shown in FIG. 21 are incremented by 1 each, the matrix shown in FIG. 21 supports a code rate 20/26.

FIG. 22 is a diagram of an example that a single row of the model matrix shown in FIG. 21 is split into two rows. A row 501 shown in FIG. 21 is split into rows 501A and 501B shown in FIG. 22. In this case, it can be observed that elements having weights on $0^{th}$ to $23^{rd}$ columns are exclusively distributed. And, it can be observed that a shift number '117' is added to a $26^{th}$ column. In this case, since a sum of weights of the $26^{th}$ column is an even number, a corresponding influence can be ignored by a modulo operation. Hence, it can be observed that a model matrix shown in FIG. 22 is an equivalent matrix to the model matrix shown in FIG. 12, FIG. 20 or FIG. 21. Meanwhile, row and column numbers of the matrix shown in FIG. 22 are incremented by 1 each, the matrix shown in FIG. 22 supports a code rate ¾.

FIG. 23 is a diagram of an example that a single row of the model matrix shown in FIG. 22 is split into two rows. A row 502 shown in FIG. 22 is split into rows 502A and 502B shown in FIG. 23. In this case, it can be observed that elements having weights on $0^{th}$ to $23^{rd}$ columns are exclusively distributed. And, it can be observed that a shift number '113' is added to a $27^{th}$ column. In this case, since a sum of weights of the $27^{th}$ column is an even number, a corresponding influence can be ignored by a modulo operation. Hence, it can be observed that a model matrix shown in FIG. 23 is an equivalent matrix to the model matrix shown in FIG. 12, FIG. 20, FIG. 21 or FIG. 22. Meanwhile, row and column numbers of the matrix shown in FIG. 23 are incremented by 1 each, the matrix shown in FIG. 23 supports a code rate 20/28.

In case that a row is split, each of the model matrixes shown in FIGS. 20 to 23 additionally includes a non-zero element to make a sum of column become an even number. In this case, it is preferable that the added non-zero element should consider the characteristics of cycle-4 and cycle-6. Namely, it is preferable that the added non-zero element is determined to minimize the number of the cycle-4 or cycle-6.

In case that each of the model matrixes shown in FIGS. 20 to 23 is expanded to a parity check matrix, it has the following cycle characteristics. The following example corresponds to a case that a sub-block of a model matrix has a 24×24 size.

TABLE 3

|  | Cycle-4 | Cycle-6 | Average VAR degree |
|---|---|---|---|
| FIG. 12 (r = 5/6) | 0 | 9672 | 3.08 |
| FIG. 20 (r = 4/5) | 0 | 5832 | 3.04 |
| FIG. 21 r = 10/13) | 0 | 3384 | 3.00 |
| FIG. 22 (r = 3/4) | 0 | 1944 | 2.96 |
| FIG. 23 (r = 5/7) | 0 | 1056 | 2.93 |

Thus, through the added non-zero element, the number of cycles and the number of weights are smaller than those of a parity check matrix having a low code rate, respectively.

A method of performing encoding/decoding using the model matrix according to the second embodiment of the present invention is explained as follows.

First of all, it is able to generate a new equivalent matrix by exchanging rows or columns of the model matrix shown in FIG. 23 for example. In particular, it is able to generate a new equivalent matrix using a row and column permutation scheme.

FIG. 24 is a diagram of a new equivalent matrix having rows or columns switched from each other according to the second embodiment of the present invention. Referring to FIG. 24, it is able to obtain a model matrix shown in FIG. 24 by exchanging $0^{th}$ row and $1^{st}$ row with each other.

FIG. 25 is a diagram of a new equivalent matrix having rows or columns switched from each other according to the second embodiment of the present invention. Referring to FIG. 25, it is able to obtain a model matrix shown in FIG. 25 by exchanging $23^{rd}$ column and $27^{th}$ column with each other.

FIG. 26 is a diagram of a new equivalent matrix having rows or columns switched from each other according to the second embodiment of the present invention. Referring to FIG. 26, it is able to obtain a model matrix shown in FIG. 26 by exchanging $26^{th}$ column and $20^{th}$ column with each other.

FIG. 27 is a diagram of a new equivalent matrix having rows or columns switched from each other according to the second embodiment of the present invention. Referring to FIG. 27, it is able to obtain a model matrix shown in FIG. 27 by exchanging $20^{th}$ column and $21^{st}$ column with each other.

FIG. 28 is a diagram of a new equivalent matrix having rows or columns switched from each other according to the second embodiment of the present invention. Referring to FIG. 28, it is able to obtain a model matrix shown in FIG. 28 by exchanging $27^{th}$ column and $22^{nd}$ column with each other.

Figure 29:
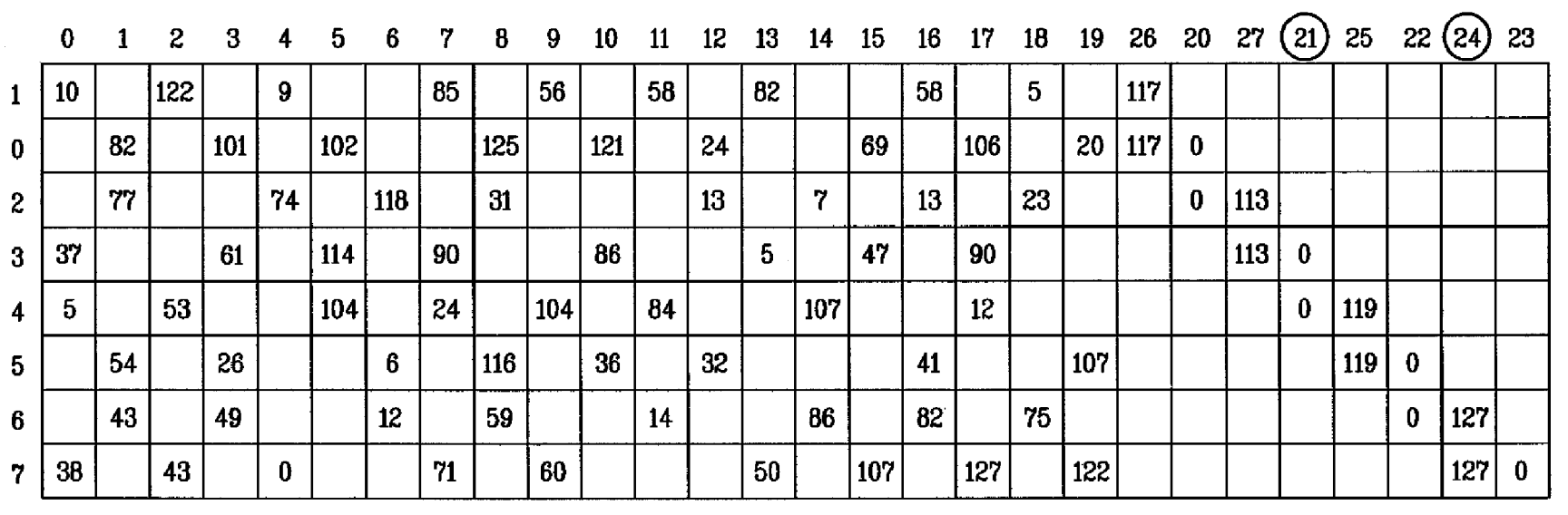

FIG. 29 is a diagram of a new equivalent matrix having rows or columns switched from each other according to the second embodiment of the present invention. Referring to FIG. 29, it is able to obtain a model matrix shown in FIG. 29 by exchanging $21^{st}$ column and $24^{th}$ column with each other.

It can be observed that the model matrix shown in FIG. 29 includes a parity part having a dial diagonal configuration. Namely, it is more efficient for a real system to use the structure of the consecutive parity parts shown in FIG. 29.

A transmitter according to the second embodiment of the present invention performs encoding using a mother matrix proposed by the second embodiment of the present invention and then generates 'encoded blocks' ranging from $0^{th}$ column to $27^{th}$ column. An encoded block means that information bits and parity bits corresponding to each of 28 columns of the model matrix are grouped. In particular, the encoded blocks 0 to 27 correspond to a single LDPC codeword. The encoded block corresponding to an information part is named 'information block' and the encoded block corresponding to a parity part is named 'parity block'.

The model matrixes shown in FIG. 12 and FIGS. 20 to 29 are generated by the row split, the row exchange, and the column exchange according to the second embodiment of the present invention. Hence, a transmitter or receiver can store a single matrix and it then able to design the model matrixes shown in FIG. 12 and FIGS. 20 to 29 freely by the method proposed by the second embodiment of the present invention. For instance, the transmitter or receiver keeps storing the matrix shown in FIG. 12 only and the transforms the matrix shown in FIG. 12 into one of the matrixes shown in FIGS. 20 to 29 in accordance with a variation of a code rate. Alternatively, a model matrix can be pre-generated by row splits from the model matrix and stored in the transmitter or receiver, Thereafter, the transmitter or receiver can use the stored model matrix to encode data.

If encoding is carried out using the model matrix shown in FIG. 29, twenty information blocks corresponding to $0^{th}$ to $19^{th}$ columns and eight parity blocks corresponding to $20^{th}$ to $27^{th}$ columns are generated. In this case, since column exchange has performed on the model matrix shown in FIG. 29, a single LDPC codeword has the following sequential block structure as shown in Table 4.

TABLE 4

[0, 1, 2, 3, 4, 5, 6, 7, 8, 9, 10, 11, 12, 13, 14, 15, 16, 17, 18, 19, 26, 20, 27, 21, 25, 22, 24, 23]

In Table 4, each numeral indicates an encoded block corresponding to each column shown in FIG. 29.

An IR scheme according the second embodiment of the present invention is explained as follows.

First, a transmitter is able to perform encoding using a model matrix shown in FIG. 28. If encoding is carried out in accordance with the model matrix shown in FIG. 29, twenty-eight encoded blocks corresponding to columns are generated. In particular, twenty blocks corresponding to $0^{th}$ to $19^{th}$ columns become information blocks and eight blocks corresponding to $20^{th}$ to $27^{th}$ columns become parity blocks. In this case, the transmitter synthesizes various kinds of information and is then cable to decide to perform an initial transmission at a code rate ⅚.

In order to support the code rate ⅚, twenty information blocks and four parity blocks should be transmitted. So, the transmitter generates an LDPC codeword including information blocks corresponding to $0^{th}$ to $19^{th}$ columns and parity blocks corresponding to $21^{st}$, $21^{st}$, $2^{nd}$ and $23^{rd}$ columns and then transmits the generated LDPC codeword to a receiver. In particular, by transmitting twenty information blocks and four parity blocks, the code rate ⅚ can be supported. In brief, the transmitter uses the codeword shown in Table 5 for an initial transmission.

TABLE 5

[0, 1, 2, 3, 4, 5, 6, 7, 8, 9, 10, 11, 12, 13, 14, 15, 16, 17, 18, 19, 20, 21, 22, 23]

Since a currently used code rate is ⅚, the receiver according to the second embodiment of the present invention carries out LDPC decoding using a matrix shown in FIG. 23. A model matrix shown in FIG. 30 is equivalent to a model matrix shown in FIG. 12. Hence, decoding is carried out in accordance with the code rate ⅚.

After decoding has been carried out, if the decoding fails, the receiver transmits NACK to the transmitter. The transmitter having received the NACK caries out a retransmission by lowering a code rate. For instance, the retransmission can be carried out at a code rate 20/26. In this case, instead of performing new encoding, the transmitter preferably uses the previously generated $24^{th}$ and $25^{th}$ parity blocks for the retransmission only. Namely, the transmitter additionally transmits the $24^{th}$ and $25^{th}$ parity blocks only.

The receiver receives the additionally transmitted $24^{th}$ and $25^{th}$ parity blocks and then performs decoding. In particular, the decoding can be carried out at a code rate 20/20. FIG. 31 is a diagram of an example for a model matrix used for the receiver to decode retransmitted data. Referring to FIG. 31, a matrix shown in FIG. 31 is equivalent to a matrix shown in FIG. 21.

The receiver performs the decoding by combining the additionally received parity blocks corresponding to the $24^{th}$ and $25^{th}$ columns, the previously stored information blocks corresponding to the $0^{th}$ to $19^{th}$ columns, and the parity blocks corresponding to $20^{th}21^{st}$, $22^{nd}$ and $23^{rd}$ columns.

The above-explained example is for the case of performing an initial transmission at a code rate ⅚ and performing a retransmission at a code rate 20/26 if NACK is received. The above-explained example relates to a method of transmitting parity block(s) only in accordance with a variation of a code rate.

The model matrixes proposed according to the second embodiment are just exemplary for explaining the present invention, by which implementations of the present invention are not limited. Detailed code rates, the retransmission receptions and the like used in explaining the second embodiment are just exemplary to explain the second embodiment only, by which implementations of the present invention are not limited. And, the model matrixes according to the second embodiment are applicable to various communication schemes as well to the retransmission.

A model matrix capable of supporting a low code rate is sensitively affected by cycle-4 or cycle-6. And, an average column degree is lower than that of a model matrix supporting a high code rate. Namely, a model matrix having a low code rate is sparser than a model matrix having a code rate of which non-zero weight is high.

In order to support various code rates with a single mother matrix, a structure should be set in a manner that an upper part of the matrix is dense while a lower part of the matrix is sparse. Since the present invention designs a structure capable of supporting non-zero weight at a low code rate and satisfies the dense property using a row combining scheme at a high code rate, thereby designing an LDPC code more efficiently.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of performing LDPC coding using a parity check matrix having an information part and a parity part, comprising:
   providing an information bit stream for channel encoding; and
   encoding the information bit stream by using a first parity check matrix including at least two rows generated by splitting a row of a second parity check matrix,
   wherein one of the at least two rows has a weight in an element corresponding to an element having a weight in the row of the second parity check matrix,
   wherein each of the at least two rows has a weight in an element of the parity part when a sum of weights is an even number.

2. The method of claim 1, further comprising transmitting a first codeword part corresponding to a first code rate among an entire codeword.

3. The method of claim 2, wherein the first codeword part has a predetermined sequence.

4. The method of claim 3, further comprising:
   receiving negative acknowledgement (NACK) in response to the first codeword part from the receiving side; and
   transmitting a second codeword part corresponding to a second code rate among the entire codeword.

5. The method of claim 3, further comprising:
   receiving negative acknowledgement (NACK) in response to the first codeword part from the receiving side; and
   transmitting a second codeword part among the entire codeword to the receiving side, the second codeword part, when combined with the first codeword, corresponding to a second code rate.

6. The method of claim 5, wherein the second code rate is smaller than the first code rate.

* * * * *